US009590176B2

(12) United States Patent
Parkin et al.

(10) Patent No.: US 9,590,176 B2
(45) Date of Patent: Mar. 7, 2017

(54) CONTROLLING THE CONDUCTIVITY OF AN OXIDE BY APPLYING VOLTAGE PULSES TO AN IONIC LIQUID

(71) Applicant: INTERNATIONAL BUSINESS MACHINES CORPORATION, Armonk, NY (US)

(72) Inventors: Stuart Stephen Papworth Parkin, San Jose, CA (US); Mahesh G. Samant, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 13/829,690

(22) Filed: Mar. 14, 2013

(65) Prior Publication Data

US 2014/0266391 A1 Sep. 18, 2014

(51) Int. Cl.
*H03K 17/51* (2006.01)
*H01L 49/00* (2006.01)
*H01L 45/00* (2006.01)
*H01L 51/05* (2006.01)

(52) U.S. Cl.
CPC ............ *H01L 49/003* (2013.01); *H01L 45/04* (2013.01); *H01L 45/1206* (2013.01); *H01L 45/1226* (2013.01); *H01L 45/146* (2013.01); *H01L 51/055* (2013.01)

(58) Field of Classification Search
CPC ....... H03K 17/51; H01L 49/003; H01L 45/04; H01L 45/1206; H01L 45/1226; H01L 45/146; H01L 51/055; G02F 1/163; G02F 2001/1635; G09G 3/38
See application file for complete search history.

(56) References Cited

U.S. PATENT DOCUMENTS

| 5,355,235 A | 10/1994 | Nishizawa et al. |
| 6,426,903 B1 | 7/2002 | Clevenger et al. |
| 2011/0227031 A1 | 9/2011 | Li et al. |
| 2012/0091421 A1 | 4/2012 | Wen et al. |
| 2012/0211716 A1 | 8/2012 | Meyer |

OTHER PUBLICATIONS

Dhoot, A. S. et al., "Increased Tc in Electrolyte-Gated Cuprates", Advanced Materials, 2010, 22, 2529-2533.*

(Continued)

*Primary Examiner* — Xiuyu Tai
(74) *Attorney, Agent, or Firm* — Daniel E. Johnson

(57) ABSTRACT

Electrolyte gating with ionic liquids is a powerful tool for inducing conducting phases in correlated insulators. An archetypal correlated material is $VO_2$ which is insulating only at temperatures below a characteristic phase transition temperature. We show that electrolyte gating of epitaxial thin films of $VO_2$ suppresses the metal-to-insulator transition and stabilizes the metallic phase to temperatures below 5 K even after the ionic liquid is completely removed. We provide compelling evidence that, rather than electrostatically induced carriers, electrolyte gating of $VO_2$ leads to the electric field induced creation of oxygen vacancies, and the consequent migration of oxygen from the oxide film into the ionic liquid.

16 Claims, 20 Drawing Sheets

(56) References Cited

OTHER PUBLICATIONS

Liu, K., et al., "Dense Electron System from Gate-Controlled Surface Metal-Insulator Transition", Nano Letters, 2012, 6272-6277.*

Mabeck, J.T., et al., "Microfluidic gating on an organic electrochemical transistor", Applied Physics Letters, 87, 013503, 2005.*

Zhou et al, "Relaxation dynamics of ionic liquid-VO2 interfaces and influence in electric double-layer transistor", Journal of Applied Physiscs,111, 084508, (2012), p. 1-7.*

C. H. Ahn et al., "Electrostatic modification of novel materials", Rev. Mod. Phys. vol. 78, pp. 1185-1212, Oct.-Dec. 2006.

J. Cao et al., "Strain engineering and one-dimensional organization of metal-insulator domains in single-crystal vanadium dioxide beams", Nat. Nano. pp. 1-6, Sep. 2009.

Jeong Ho Cho et al., "Printable ion-gel gate dielectrics for low-voltage polymer thin-film transistors on plastic", Nat. Mater. vol. 7, pp. 900-906, Nov. 2008.

Maciej Galinski et al., "Ionic liquids as electrolytes", Electrochimica Acta 51, pp. 5567-5580, Mar. 2006.

Masatoshi Imada et al., "Metal-insulator transitions", Rev. Mod. Phys. vol. 70, No. 4, pp. 1039-1263, Oct. 1998.

M. Nakano et al., "Collective bulk carrier delocalization driven by electrostatic surface charge accumulation", Nature vol. 487, pp. 459-462, Jul. 2012.

* cited by examiner

| Figure | Substrate | Thickness (nm) | Channel area (µm$^2$) |
|---|---|---|---|
| 1D | Al$_2$O$_3$ (10$\bar{1}$0) | 20 | 100 × 10 |
| 1E, 2D (Hall) | TiO$_2$(001) | 10 | 100 × 10 |
| 2A, 2C, 2D | TiO$_2$(001) | 10 | 100 × 5 |
| 8, 9, 10 | Al$_2$O$_3$ (10$\bar{1}$0) | 20 | 100 × 20 |
| 3A | TiO$_2$(001) | 10 | 900 × 300 |
| 3B, 5 | Al$_2$O$_3$ (10$\bar{1}$0) | 20 | 900 × 300 |
| 3D (Sample 1) | Al$_2$O$_3$ (10$\bar{1}$0) | 40 | 900 × 300 |
| 3D (Sample 2) | Al$_2$O$_3$ (10$\bar{1}$0) | 20 | 900 × 300 |
| 4A, 4B | Al$_2$O$_3$ (10$\bar{1}$0) | 20 | 100 × 10 |
| 7A, 7B | Al$_2$O$_3$ (10$\bar{1}$0) | 20 | 100 × 10 |

FIG. 13

CONTROLLING THE CONDUCTIVITY OF AN OXIDE BY APPLYING VOLTAGE PULSES TO AN IONIC LIQUID

TECHNICAL FIELD

The invention relates to electrolyte gating, and more particularly, to the use of ionic liquids for reversibly changing the conductivity in correlated insulators by the controlled flow of currents of ionized species.

BACKGROUND

The electric-field induced metallization of correlated insulators is a powerful means of creating novel electronic phases but requires high electric fields often beyond those achievable by conventional dielectric gates (1-3). Such fields can be achieved at interfaces using Schottky junctions (4) or polar materials (5, 6) or at surfaces by using ionic liquids (ILs) (7) as the gate dielectric in field effect transistor devices (8-10). The latter method allows for tunable electric fields without restriction on the channel material or its crystal orientation. One of the most interesting and widely studied materials is the correlated insulator $VO_2$ (11, 12) which exhibits a metal to insulator phase transition (MIT) as the temperature is reduced below ~340 K in bulk material (13). Recently, electrolyte gating has been shown to dramatically alter the properties of thin films of $VO_2$, in particular, the metallization of the insulating state was achieved and attributed to the introduction of small numbers of carriers that are electrostatically induced by the gating process (14). This would be consistent with the destabilization of a Mott insulating state in $VO_2$ that depends critically on electronic band half-filling, which has been a long-standing goal in condensed matter physics (15).

SUMMARY

We find that an entirely different mechanism accounts for the electrolyte gating suppression of the MIT to low temperatures in epitaxial thin films of $VO_2$ that we have prepared on $TiO_2$ and $Al_2O_3$ single crystal substrates. In particular, the movement of oxygen in and out of $VO_2$ appears to account for the experimentally determined change in conductivity.

One aspect of the invention is a method for use with an oxide layer (e.g., $VO_2$) having a surface over which an ionic liquid is disposed. The method includes applying a first voltage to the ionic liquid to stimulate the motion of either cations or anions within the liquid towards the surface, such that oxygen is driven from the oxide into the liquid, thereby changing the conductivity of the oxide layer from insulating (or semiconducting) to metallic. The method also includes applying a second voltage, whose polarity is opposite to the first voltage, to the ionic liquid to cause the motion of oxygen back into the oxide layer, thereby changing the conductivity of the oxide layer from metallic to insulating (or semiconducting). The ionic liquid may be confined to a conduit in proximity with the oxide layer. The change in conductivity can be advantageously maintained for at least 10 nanoseconds (or at least one day or even at least one year) after the first voltage is removed from the liquid and/or the liquid is removed from the surface. The liquid may be confined to one or more discrete regions of the surface, which may be addressed by the flow of the ionic liquid.

Another aspect of the invention is a method for use with an oxide layer having a surface over which an ionic liquid is disposed. The method includes applying a first voltage to the ionic liquid, such that a first electric field is generated at the surface, thereby changing the conductivity of the oxide layer from insulating (or semiconducting) to metallic. The method further includes applying a second voltage, whose polarity is opposite to the first voltage, to the ionic liquid to generate a second electric field having a polarity opposite to that of the first electric field, thereby changing the conductivity of the oxide layer from metallic to insulating (or semiconducting). The first electric field drives oxygen from the oxide into the liquid, and the second electric field drives oxygen from the liquid into the oxide.

Yet another aspect of the invention is a method for use with an oxide layer having a surface over which an ionic liquid is disposed. The method includes inducing a first (compositional) inhomogeneity in the ionic liquid, such that a first electric field is generated at the surface, thereby changing the conductivity of the oxide layer from insulating (or semiconducting) to metallic. The method further includes inducing a second (compositional) inhomogeneity in the ionic liquid, such that a second electric field is generated at the surface having a polarity opposite to that of the first electric field, thereby changing the conductivity of the oxide layer from metallic to insulating (or semiconducting). The first electric field drives oxygen from the oxide into the liquid, and the second electric field drives oxygen from the liquid into the oxide.

BRIEF DESCRIPTION OF THE DRAWINGS

FIG. 13. Summary of device characteristics. Substrate material and crystal orientation, nominal deposited $VO_2$ film thickness, and channel area for the devices used in this study. The oxygen pressure during growth was 10 mTorr for all devices in this Table. The film thicknesses were calibrated by RBS.

DETAILED DESCRIPTION

Figure 1A:
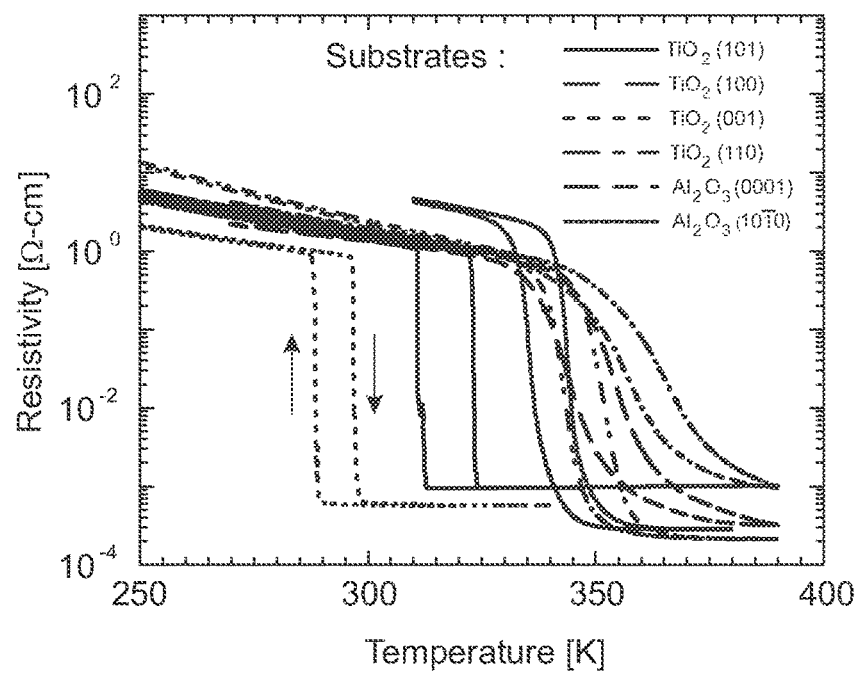
FIG. 1. Temperature and gate voltage dependent conductivity of epitaxial $VO_2$ thin films. (A) Resistivity versus temperature curves for $VO_2$ films grown on various orientations of $TiO_2$ and $Al_2O_3$ single crystal substrates. (B) High resolution Cu Kα θ-2θ x-ray diffraction pattern of $VO_2$ films deposited on $Al_2O_3$ (10$\bar{1}$0) and $TiO_2$(001), respectively, showing highly oriented films with the c axis out of plane. (C) Optical image of a typical electrical double layer transistor device showing the droplet of the IL HMIM-TFSI. The electrical contacts can be seen in the magnified image of the channel (right). Sheet conductance versus $V_G$ for devices fabricated from $VO_2$ films prepared on (D) $Al_2O_3$ (10$\bar{1}$0) and (E) $TiO_2$(001).
Figure 1B:
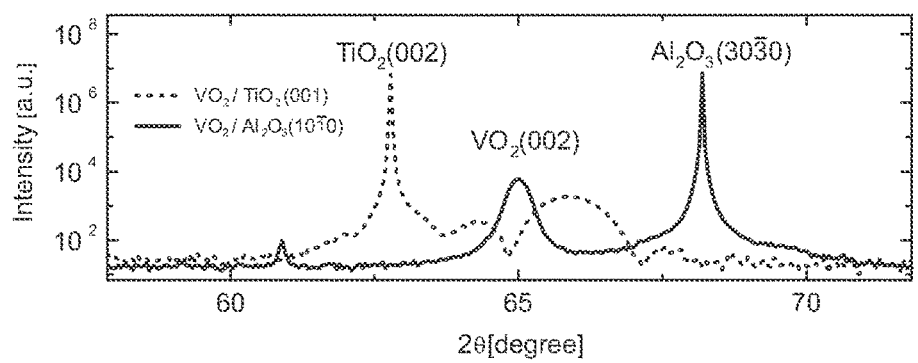

FIG. 1A shows resistivity versus temperature curves for $VO_2$ films grown by pulsed laser deposition (PLD) on various facets of $TiO_2$ and $Al_2O_3$ single crystals in an $O_2$ pressure of 10 mTorr during deposition (16). The MIT temperature ($T_{MIT}$) varied due to different strains in the $VO_2$ films (17). Henceforth, we consider films grown on $TiO_2$ (001) and $Al_2O_3$ (10$\bar{1}$0), which have a large difference in $T_{MIT}$ but have the same crystallographic orientation. For these films, high-resolution x-ray diffraction (FIG. 1B) indicates excellent epitaxial growth with the c-axis out-of-the plane. The film on $TiO_2$(001) [$Al_2O_3$ (10$\bar{1}$0)], 10 nm [20 nm] thick, is strained along the c axis by −1.2% [completely relaxed] (18, 19), and has a $T_{MIT}$ of ~290 K [340 K].

Figure 1C:
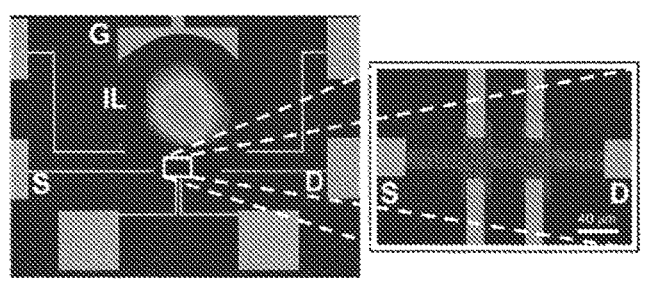
Figure 1D:
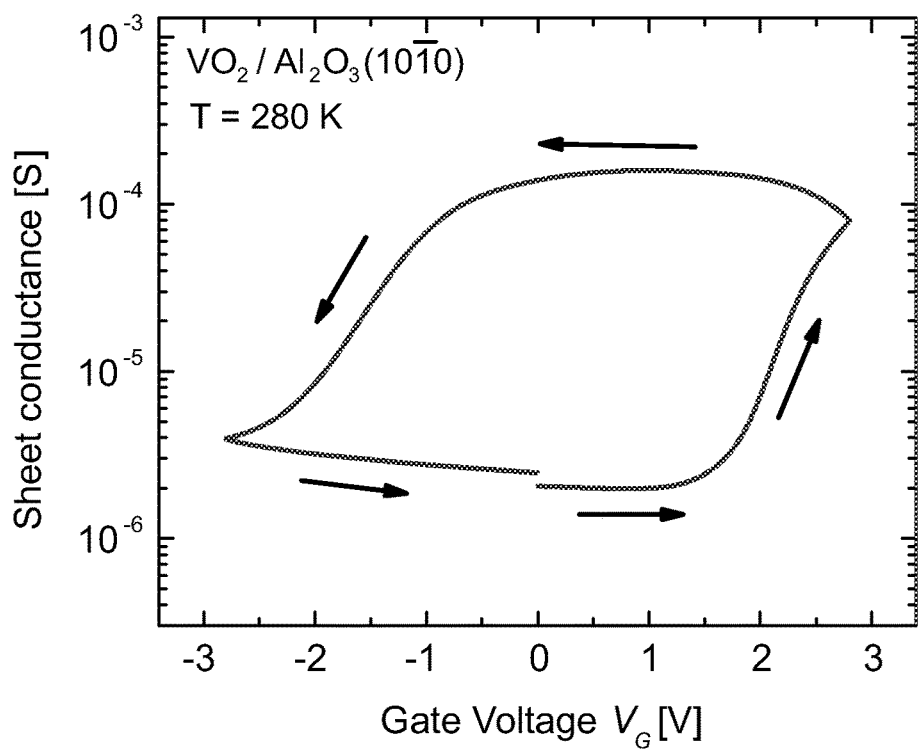
Figure 1E:
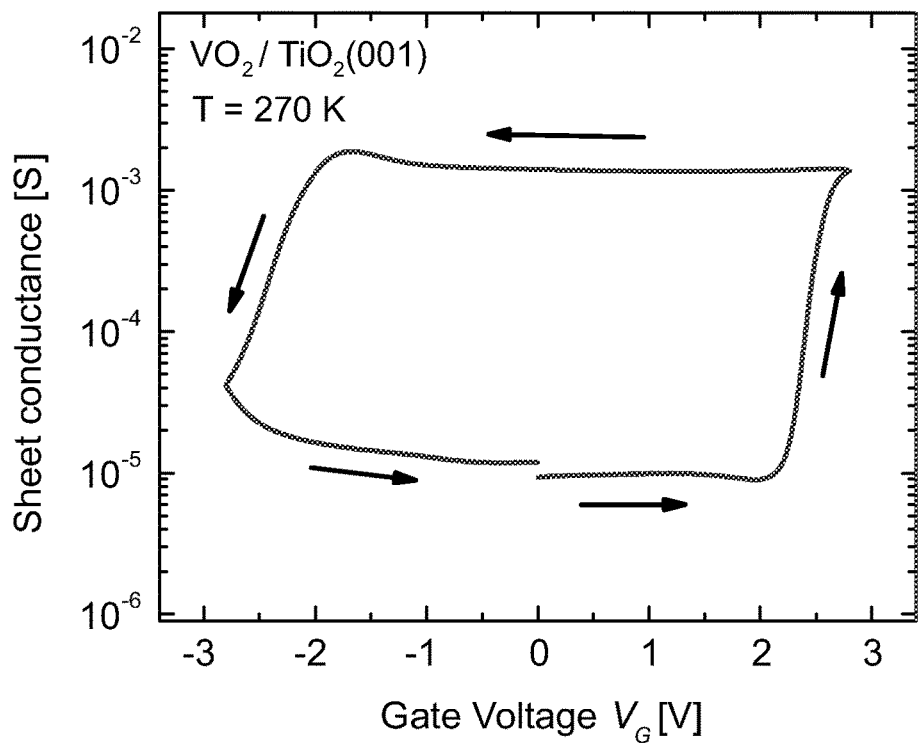
Figure 5:
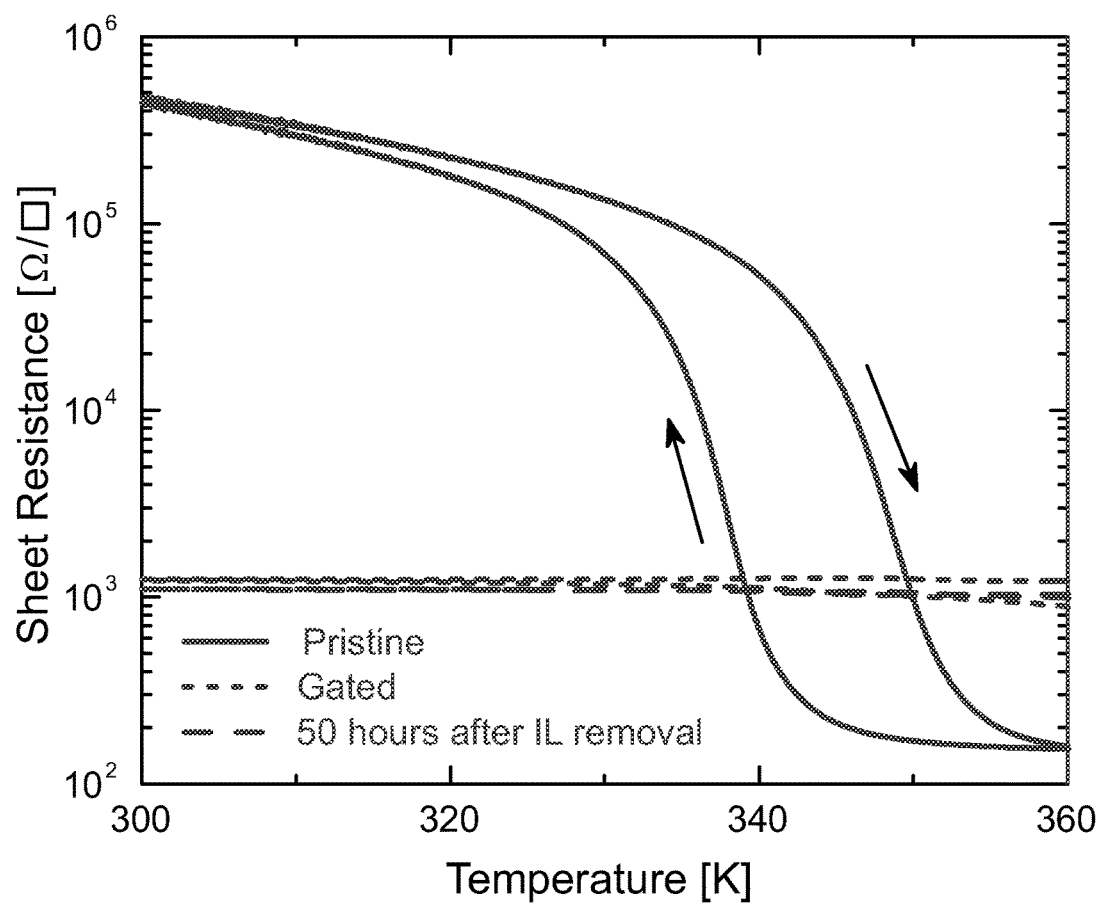
FIG. 5. Sheet resistance versus temperature for a 20 nm $VO_2/Al_2O_3$ (10$\bar{1}$0) device in pristine condition before any IL is applied (solid line) and after the device was gated to the metallic state (short dashes) by applying $V_G$=2.2 V and varying the temperature at a rate of 3 K/minute from 360 K to 300 K and back to 360 K. The IL was then removed at room temperature by washing the device in isopropyl alcohol. The device was kept at room temperature in a dry nitrogen environment for 50 hours and then the resistance versus temperature curve was remeasured under identical temperature sweep conditions without any IL being applied (see long dashes). No significant change in the metallic nature of the device was found.
Figure 6:
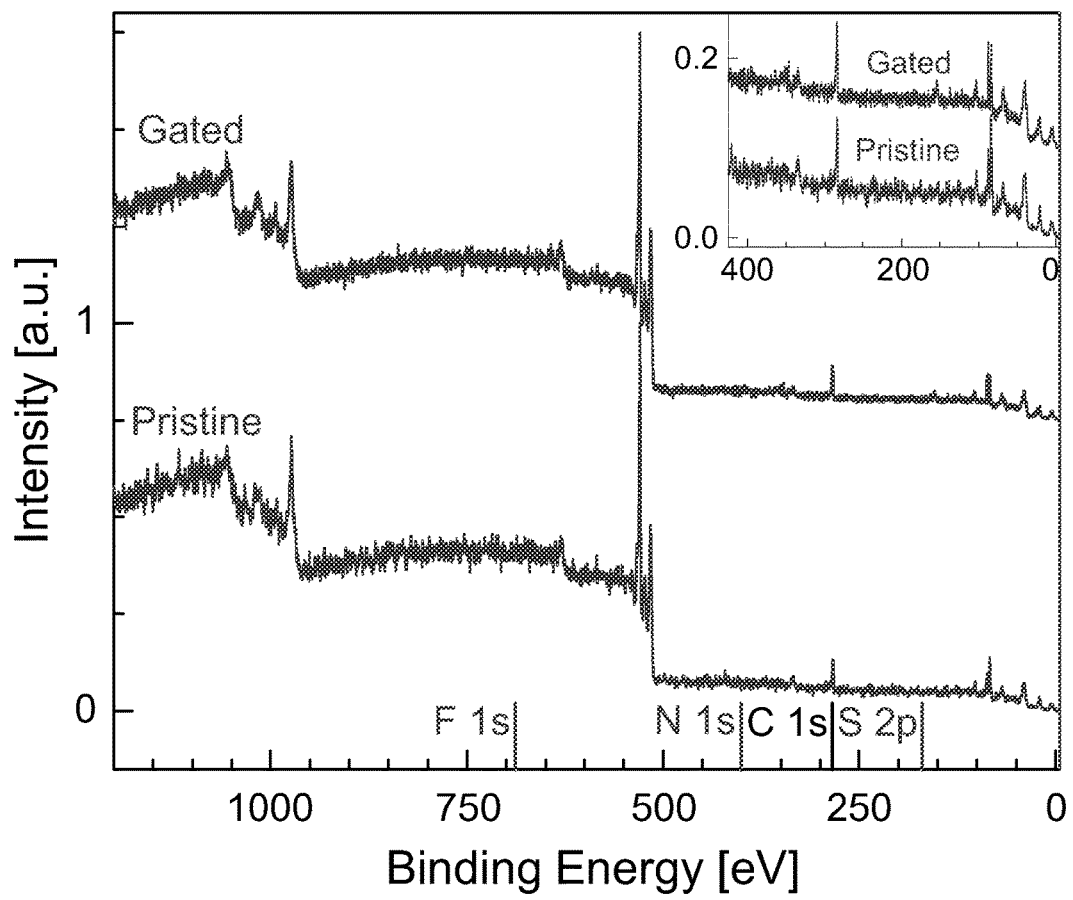
FIG. 6. XPS survey scan of a pristine and a gated device. XPS survey scans from the same sample of 10 nm $VO_2/TiO_2$(001) as in FIG. 3A. Data are shown for the device in the pristine state and after gating to suppress the MIT to low temperatures. A gate voltage of 1.8 V was applied at 300 K and the device was subsequently cooled to low temperatures to check that the metallic state was formed. After warming to room temperature the IL was removed and the XPS scans were collected. No peaks from F, N or S are found. The expected positions of the F 1s, N 1s, C 1s and S 2p peaks (31) are shown in the Figure. (The ~1.2 eV spin-orbit splitting of the S 2p core-levels is not shown.) A C 1s peak from surface contamination can be seen in the sample before and after gating and thus is not derived from IL gating. All the other peaks can be indexed to O and V from the $VO_2$ channel, Si from the $SiO_2$ dielectric and Au from the device contacts. The absence of any of the F, N or S peaks indicates that there is no electrochemical incorporation of the ionic species during the EDL gating process and also suggests that the surface cleaning prior to the XPS measurements was effective in removing the IL. The low binding energy data are plotted in the inset for clarity.

Devices for electrolyte gating (EG) studies were fabricated from 10 nm $VO_2/TiO_2$(001) and 20 nm $VO_2/Al_2O_3$ (10$\bar{1}$0) films (FIG. 1C), unless otherwise noted, using standard optical lithographic techniques. The electrical contacts to the channel include source S and drain D contacts as well as four side contacts that were used for 4-wire resistance and Hall measurements. A ~100 nl droplet of the ionic liquid (IL) 1-Hexyl-3methylimidazolium bis(trifluoromethylsulfonyl)-imide (HMIM-TFSI) covers the channel and lateral gate (G) electrode. The gate voltage ($V_G$) was swept at 5 mV/s and a source drain voltage $V_{SD}$=0.1 V was used, except where noted. Hysteresis in the sheet conductance centered about $V_G=0$ V was found for both substrates (FIGS. 1D and 1E). By sweeping $V_G$ the device can be reversibly switched between low and high conductance states. Once switched to the high conductance state, the device was stable at $V_G=0$ V and maintained its conductance for many days even if the IL was washed off the device using isopropyl alcohol (FIG. 5). To check that the IL was completely removed x-ray photoelectron spectroscopy (XPS) was carried out and no spectroscopic signature of the IL was found (FIG. 6). This suggests that the gating effect was not electrostatic in origin. Moreover, the fact that films on both types of substrates show very similar behavior rules out any appreciable influence of the substrate, for example, the role of strain. The electric field induced metallic phase, reflected in the source-drain current ($I_{SD}$), is stable over extended periods of time in the presence of the IL at $V_G=0$ V (FIG. 7A) and also for modest $V_G$, but the insulating phase can be nearly recovered by applying reverse gate voltages similar in value to those needed to induce the metallic phase (FIGS. 1D and 1E). The insulating phase can also be recovered by annealing in oxygen at modest temperatures (~200° C., FIG. 8).

Figure 2A:
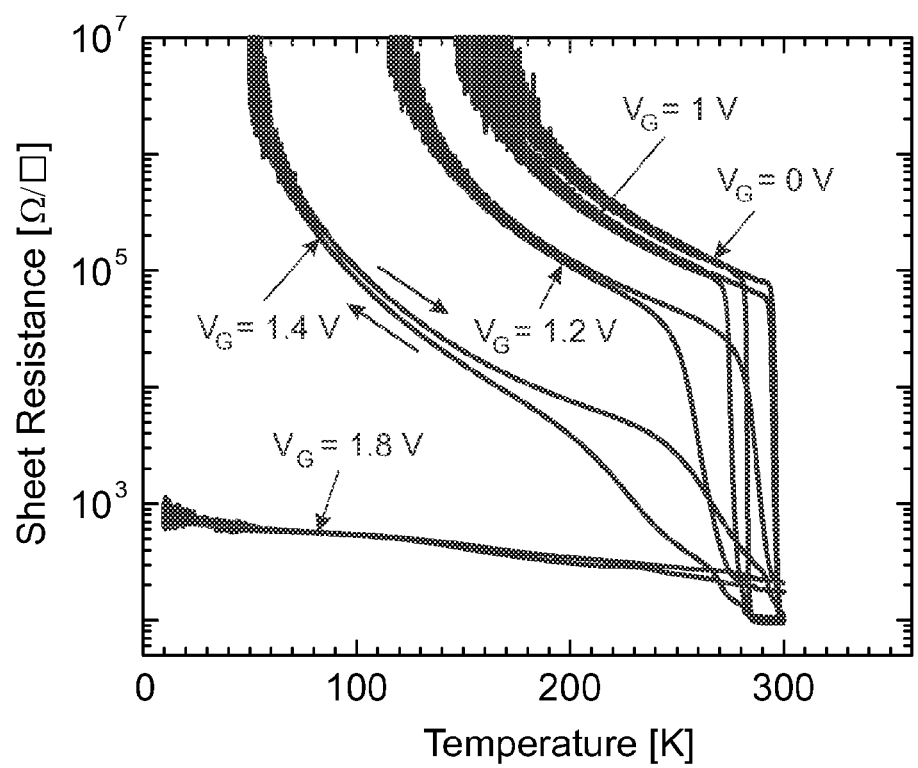
FIG. 2. Suppression of the MIT in $VO_2$ films. (A) Sheet resistance ($R_s$) versus temperature (T) for various gate voltages varying from 0 to 1.8 V for $VO_2/TiO_2$(001). (B) Resistivity of $VO_2$ versus temperature as a function of oxygen pressure used for film deposition on $TiO_2$(001). (C) $R_s$ versus T for the same device in A in its pristine state, at $V_G$=1.8 V (gated), and at $V_G$=−0.8 V (reverse gated), showing the complete recovery of the MIT in the latter case. $V_G$ was applied at 300 K for measurements in A, C, while the films were in their metallic state. (D) Sheet resistance for EG devices formed from $VO_2/TiO_2$(001) and $VO_2/Al_2O_3$ (10$\bar{1}$0), and electron carrier density $n_e$ from Hall measurements for an EG device fabricated from $VO_2/TiO_2$ (001), versus $V_G$. The dashed line is a guide to the eye.
Figure 2B:
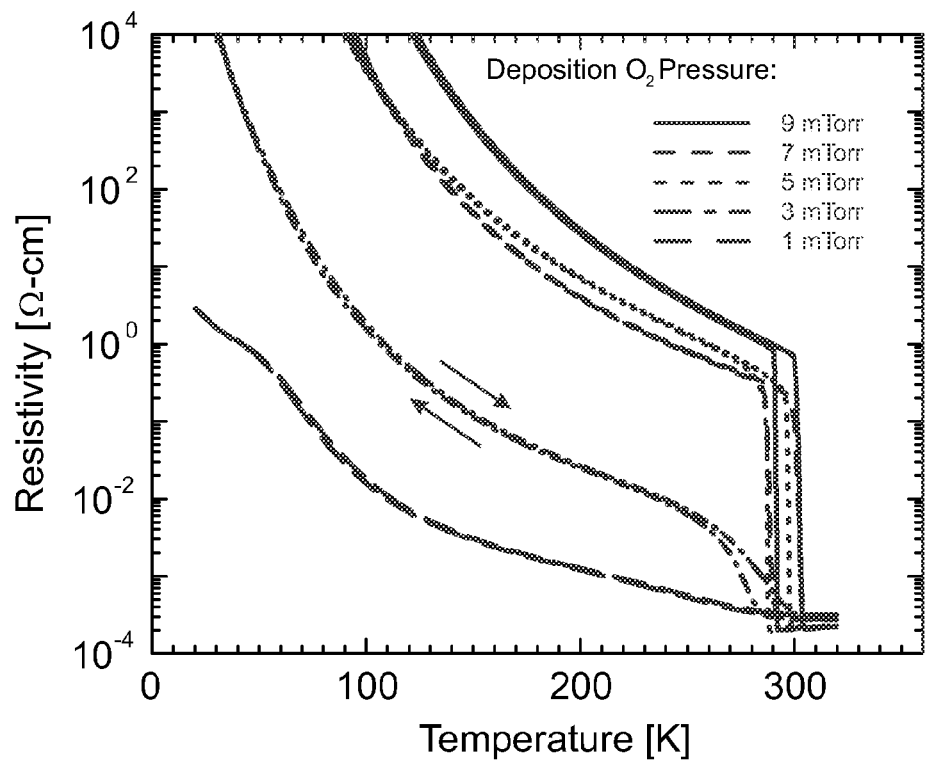

FIG. 2A shows the temperature dependence of the channel sheet resistance $R_S$ of $VO_2/TiO_2$(001) devices for several positive $V_G$. A progressive suppression of the MIT as the gate bias was increased is observed until the MIT is suppressed to below 5 K at $V_G \sim 1.8$ V. This gating effect is compared in FIG. 2B with the effect of changing the oxygen content of $VO_2$ by depositing $VO_2/TiO_2$(001) in reduced pressures of oxygen at 400° C. The $T_{MIT}$ is systematically reduced and the MIT is suppressed as the oxygen pressure is lowered from 9 mTorr. The transport data in FIGS. 2A and 2B are notably similar. In both cases the onset temperature for the MIT is decreased and the magnitude of the resistive change drops. The similarity in these data suggests that the electrolyte gating (EG) effect could also be due to the electric field induced formation of oxygen vacancies, thereby leading to a reduced MIT.

Figure 2C:
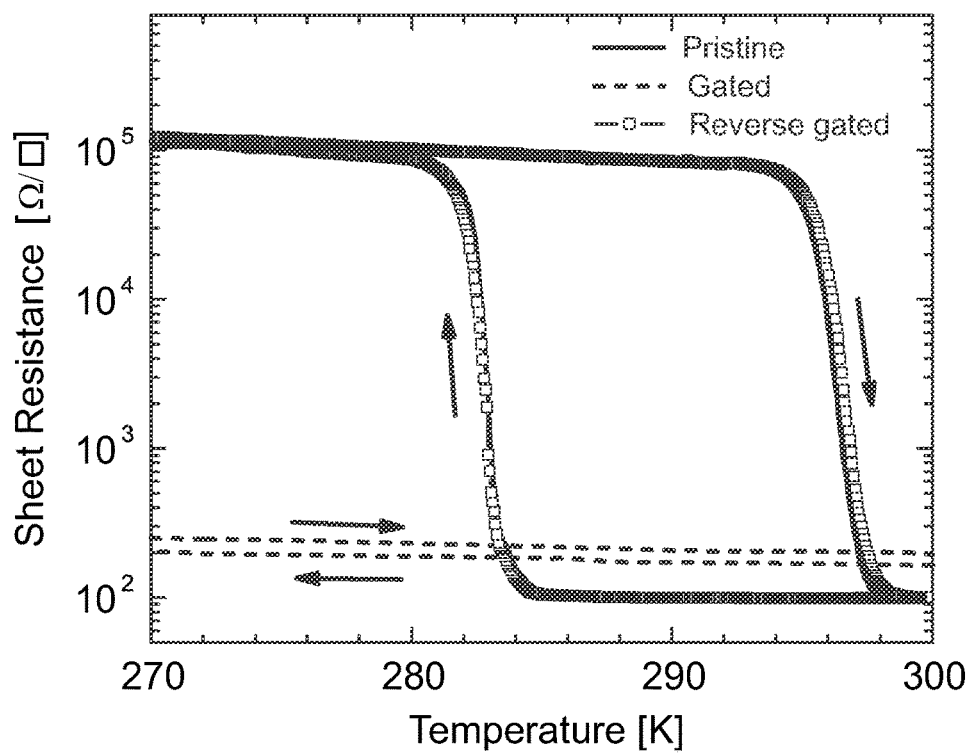

As discussed above, the $VO_2$ devices can be reversibly switched between insulating and metallic phases. The temperature dependence of the resistivity for the same device in FIG. 2A in its pristine (i.e., ungated) state and after being reversibly gated are nearly identical (FIG. 2C).

Figure 2D:
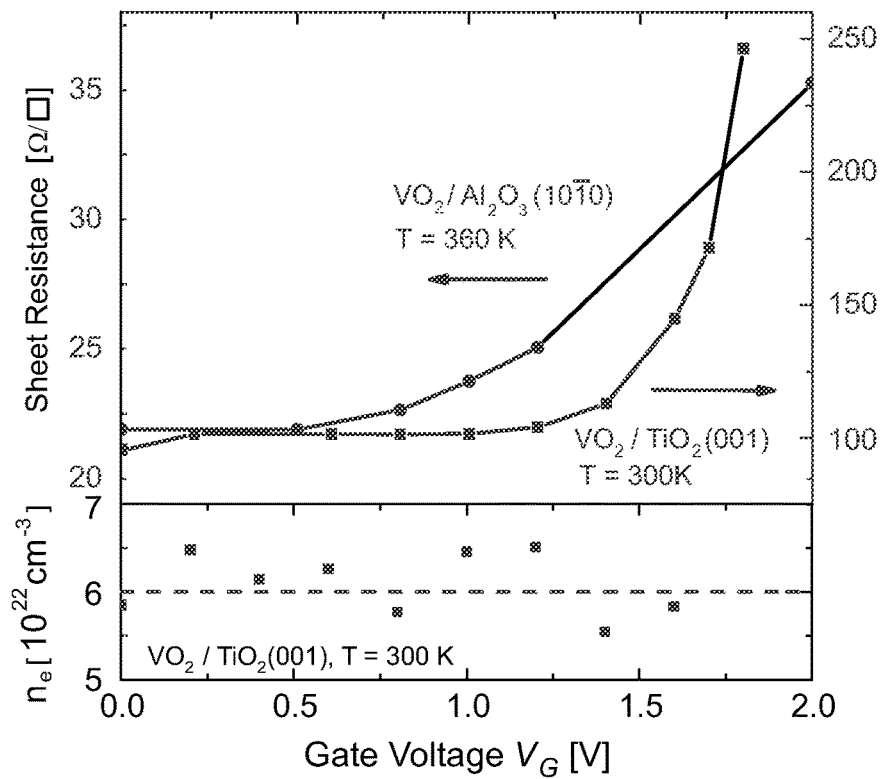
Figure 9:
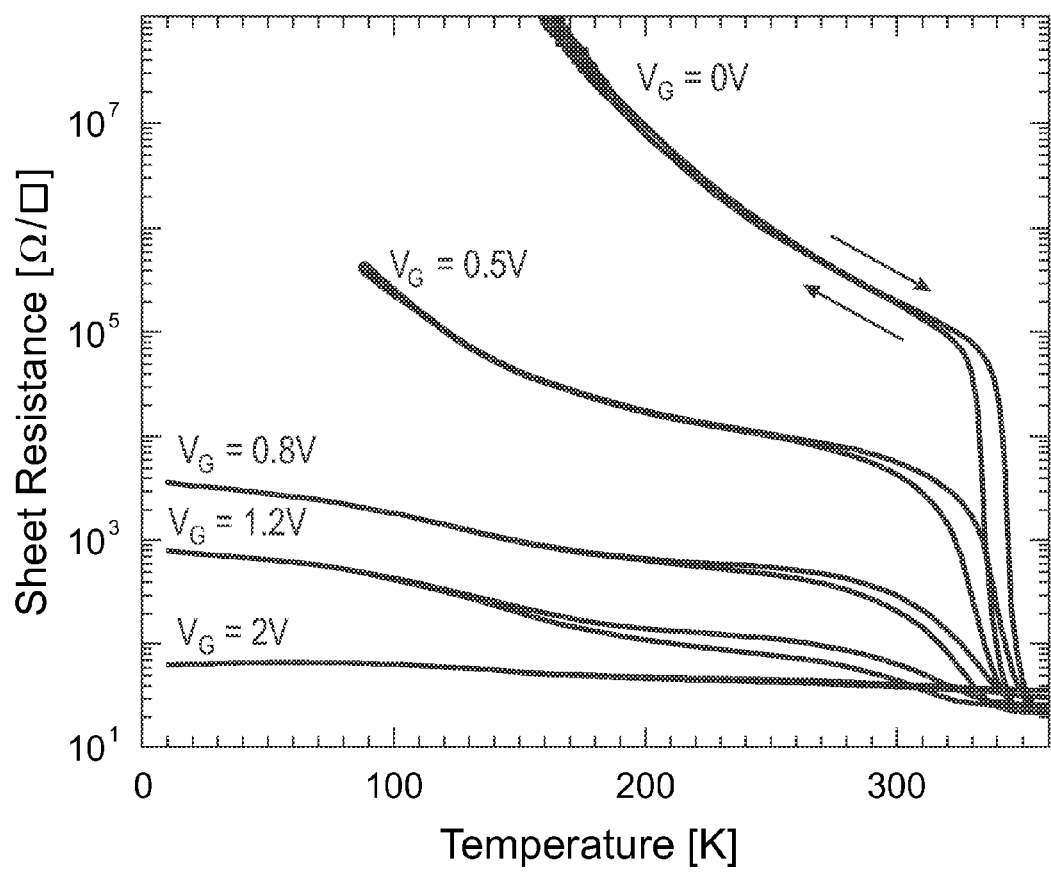
FIG. 9. Gate-voltage dependent resistance versus temperature curves for a 20 nm thick $VO_2/Al_2O_3$(10$\bar{1}$0) device for various gate voltages varying from 0 to 2 V.

The sheet resistance in the metallic phase just above the MIT is plotted versus $V_G$ in FIG. 2D for the devices used in FIG. 2A, and for devices on $Al_2O_3$ substrates in FIG. 9. For $VO_2$ devices on both substrates, $R_S$ increases considerably as $V_G$ is increased. If the gating effect were electrostatic, the electron carrier density $n_e$ should increase for positive $V_G$; thus one would anticipate a decrease rather than an increase in $R_S$. Moreover, Hall resistivity measurements for $VO_2/TiO_2$ show no evidence for any increase in $n_e$, (FIG. 2D, bottom); rather $n_e$ is independent of $V_G$ and measured to be $\sim 6 \times 10^{22}$ cm$^{-3}$, similar to bulk $VO_2$ (20).

Figures 3A, 3B, 3C:
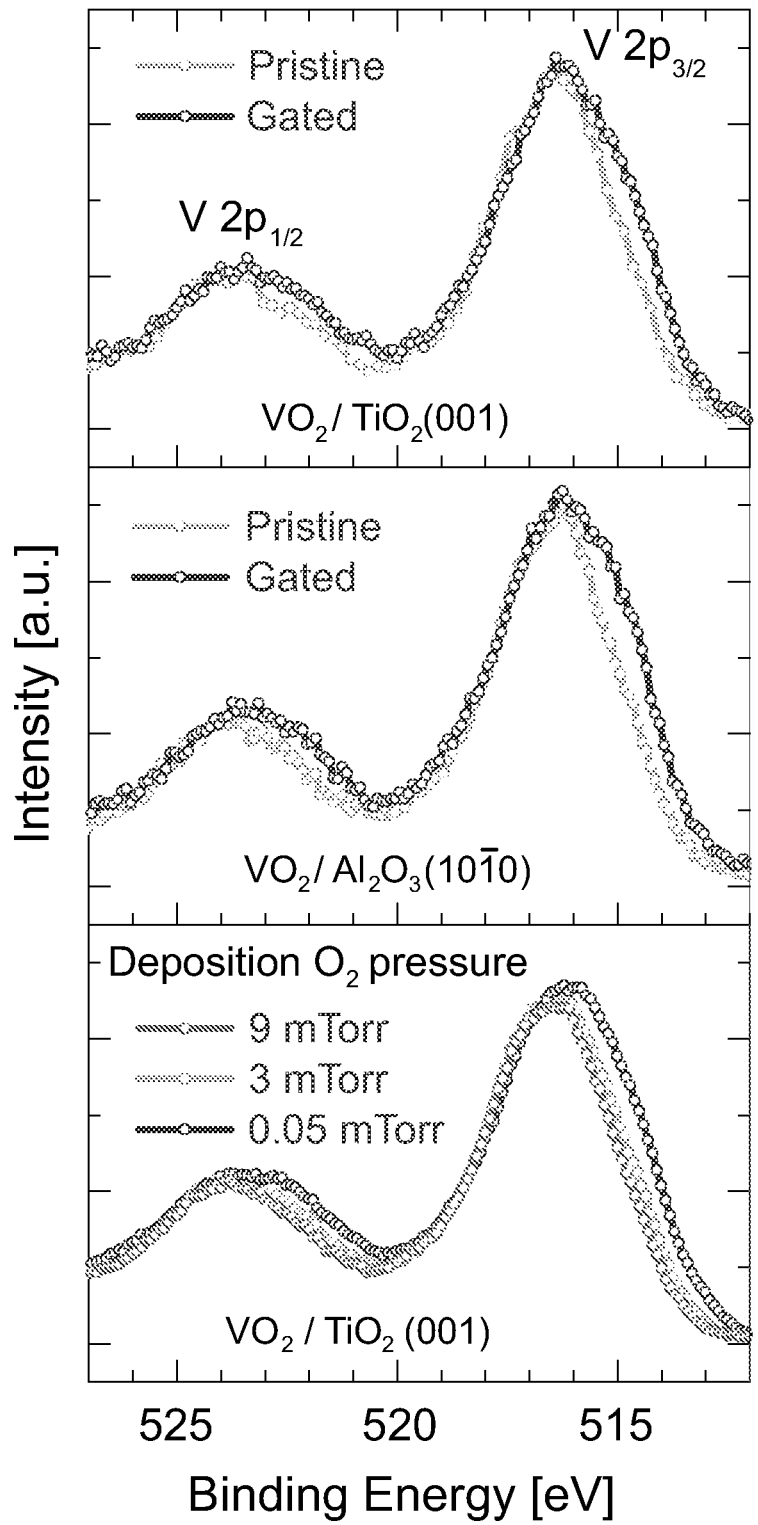
FIG. 3. V 2p core-level spectra for pristine and gated (A) $VO_2/TiO_2$(001) and (B) $VO_2/Al_2O_3$ (10$\bar{1}$0). $V_G$=1.8 V in both cases. These data are compared in (C) to spectra for $VO_2$ films deposited under reduced oxygen pressures on $TiO_2$ (001). (D) Excess $^{18}O$ concentration above the natural abundance (~0.2 atomic %) versus depth of two EG devices fabricated from 40 and 20 nm thick $VO_2$ on $Al_2O_3$ (10$\bar{1}$0) determined using SIMS. The devices were gated to the metallic state in vacuum and reverse gated to recover the insulating state in $^{18}O_2$. Data are compared to pristine channels on the same wafer that were not gated but were subject to the same dosage of $^{18}O_2$. Measurements on two different areas of sample 1 are very similar. (E) Scan at a mass resolution of 4000 (a.m.u./FWHM) showing clear separation between $^{18}O$ and $^{16}O^1H_2$ and $^{17}O^1H$.

To confirm the possibility of oxygen vacancy creation during EG that was suggested by our transport data we carried out three independent experimental studies. First, we used XPS to measure changes in the oxidation state of vanadium in gated $VO_2$ films. Devices with much larger channel areas (~900×300 μm$^2$) than those used above were fabricated to accommodate the ~150 μm diameter x-ray (Al Kα) beam size. Transport data on these devices were very similar to those shown in FIG. 2 for similar $V_G$. FIGS. 3A and B compare the V 2p core-level spectra obtained within the channel for pristine devices and the same devices gated to completely suppress the MIT to low temperatures. The results for devices fabricated on $Al_2O_3$ (10$\bar{1}$0) and $TiO_2$ (001) are similar to each other. The position of the V $2p_{3/2}$ core-level peak in the pristine sample is ~516.3 eV, close to the well established value of ~516.1 eV for $V^{4+}$ in $VO_2$. In the gated sample (for which the IL was removed) the V $2p_{3/2}$ core-level peak broadens and is shifted towards lower binding energy (BE) by ~0.2 eV. (Note that the peak is observed to be at ~515.8 eV for $V^{3+}$ in $V_2O_3$.) These observations indicate a reduction in the oxidation state of V from $V^{4+}$ towards $V^{3+}$ (21). Similarly, in situ measured films prepared in various pressures of oxygen (FIG. 3C) have V 2p peaks that shift systematically to lower BEs and broaden monotonically as the oxygen pressure is reduced. Thus, the V oxidation state continuously evolves towards $V^{3+}$ concomitant with a suppression of the MIT (as shown in FIG. 2B).

Figure 3D:
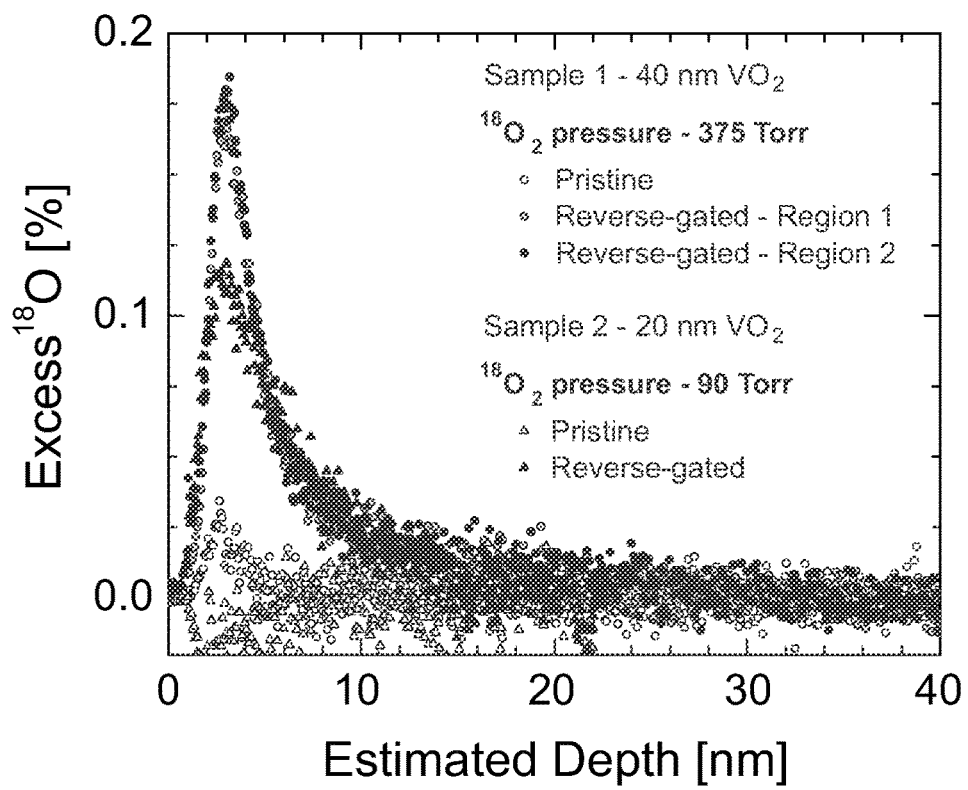

The changes in the oxidation state of V observed by XPS strongly indicate the formation of oxygen vacancies. In the absence of electric fields the formation energies of oxygen vacancies in rutile oxides are known to be very high (22). However, we hypothesize that the electric fields created at the electric double layer (EDL) at the IL/oxide interface are sufficiently high (23) to drive oxygen out of the $VO_2$ surface into the IL, and that once the oxygen vacancies are created, these vacancies are stable in the absence of the EDL at $V_G=0$. This explains the non-volatility of the gating (FIGS. 1D and 1E). To test this hypothesis we carried out gating in a high vacuum chamber in which we could introduce $^{18}O_2$. First, an EG device with a large channel area (900×300 μm$^2$) was gated in high vacuum ($V_G=3$ V) to suppress the MIT to low temperatures. After gating for long times (~10-20 min) the channel conductance is found to be nearly saturated and remains unchanged when $V_G$ is reduced to zero (16). Once a stable channel current was obtained, $^{18}O_2$ was introduced into the chamber at $V_G=0$ V. Then a reverse gate voltage of −1.5 V was applied until the insulating state was recovered, which took several hours. This procedure was repeated 3 and 4 times, respectively, for two different devices that we will label sample 1 and sample 2. Samples 1 and 2 were fabricated from 40 and 20 nm $VO_2/Al_2O_3$ (10$\bar{1}$0), respectively. Depth profile secondary ion mass spectrometry (SIMS) was then performed on these samples. A comparison was made to pristine regions on the same sample that were otherwise subjected to identical procedures concurrently. In the latter case no excess $^{18}O$ above its natural isotopic abundance in oxygen of 0.2 atomic percent was measured. However, a significant increase in the concentration of $^{18}O$ to nearly twice the natural abundance is found at the surfaces of both devices in the gated channels with a higher value in sample 1, the device that was gated in higher pressures of $^{18}O_2$ (FIG. 3D). The excess $^{18}O$ is seen to depths of nearly 20 nm from the oxide surface with similar depth profiles for the two samples. The significant incorporation of $^{18}O$ within the $VO_2$ channels during reverse gating supports our hypothesis that gating creates oxygen vacancies within the channel.

Figures 4A, 4B:
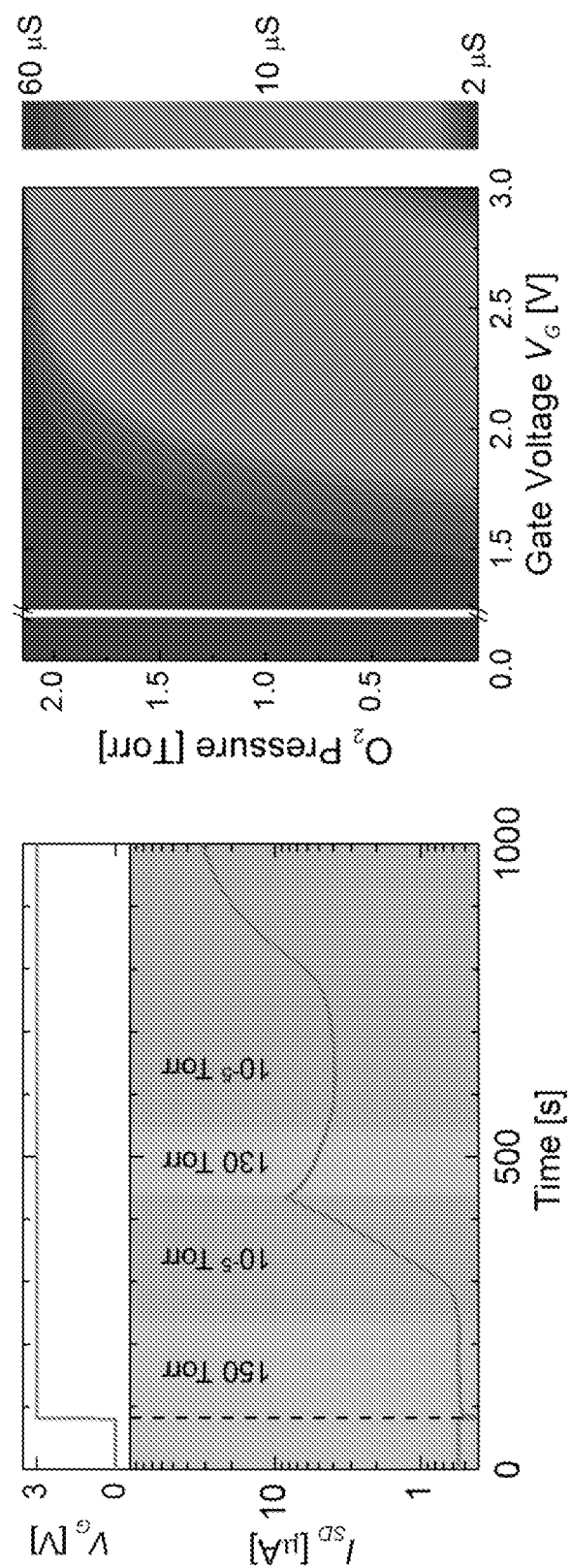
FIG. 4. Electrolyte gating of device fabricated from $VO_2/Al_2O_3$ (10$\bar{1}$0) in the presence of oxygen at 300 K. (A) Source-drain current at $V_G$=3 V versus time as the $O_2$ pressure was varied from an initial pressure of 150 Torr, gradually to $10^{-5}$ Torr, abruptly to 130 Torr and finally gradually to $10^{-5}$ Torr (indicated schematically by the gray scale). (B) Sheet conductance (gray scale) as a function of $V_G$ and oxygen pressure.

Given the large area of the channel, the most likely migration path for the oxygen that must be released to create the vacancies during gating is into the IL. Then one might speculate that saturation of the IL with oxygen would prevent such migration. FIG. 4A indeed shows that there is no change in the source-drain current even when a large $V_G$ is applied in the presence of 150 Torr $O_2$ to a 100×20 μm$^2$ device of $VO_2/Al_2O_3$ (10$\bar{1}$0). After 200 s, $O_2$ was pumped out from the chamber and, concomitantly, $I_{SD}$ gradually increases. When oxygen is reintroduced into the chamber, while maintaining $V_G=3$ V, $I_{SD}$ starts to decrease. We find a clear correlation between the source-drain current and the amount of oxygen in the chamber. A detailed dependence of the sheet conductance on $V_G$ and $P_{O_2}$ is shown in FIG. 4B. Significant gating effects were found only at low oxygen pressures (for $V_G > \sim 1.5$ V).

Our experiments show that modest gate voltages result in the electric field induced migration of oxygen into and out of the IL even though the energy required to create an oxygen vacancy in $VO_2$ in zero electric field is high. This phenomenon is likely to be common to many experiments using high electric fields, especially those using IL gating: Many of these experiments have been interpreted by the electrostatic creation of carriers. Our results also suggest that the electric field induced migration of species into and out of electrolyte gated materials is an exciting avenue for the creation of novel, non-equilibrium phases of matter.

Experimental Details

Preparation of $VO_2$ Films

Single crystal films of $VO_2$ were prepared from polycrystalline $VO_2$ or $V_2O_3$ targets by a pulsed laser deposition (PLD) technique on various substrates using a laser energy density of $\sim 1.3$ J/cm$^2$, a repetition rate of 2 Hz, and a target to substrate distance of $\sim 7.1$ cm. The thicknesses of the samples varied from 7 nm to 20 nm. Growth temperatures of 400° C., 500° C. and 700° C. were used for $TiO_2$ (001) and (101), $TiO_2$ (100) and (110), and $Al_2O_3$ (0001) and (10$\bar{1}$0) substrates, respectively, as they yielded the largest change in resistance at the metal to insulator transition (MIT). The highest quality films were obtained for oxygen deposition pressures of at least 9 mTorr. Film quality and properties were not much affected for oxygen pressures that were varied between 9 and 15 mTorr. High-resolution x-ray diffraction (XRD) data and Rutherford backscattering spectroscopic (RBS) analysis showed all $VO_2$ films were epitaxial, single crystalline, and stoichiometric. Room temperature XRD measurements (see FIG. 1B) show only (001) peaks (rutile coordinate system) indicating that these films are epitaxially oriented with the c-axis pointing out of the plane of the substrate. However, for $VO_2$ films grown on $TiO_2$(001), cracks were observed in Atomic Force Microscopy (AFM) images of films that were thicker than approximately 20 nm, presumably due to the large tensile misfit strain. From bulk lattice constants (18, 19) the in-plane value of the unstrained $VO_2$ film lattice constant (a=4.532 Å) is $\sim 1.4\%$ smaller than that of $TiO_2$ (a=4.591 Å). From our x-ray data we find that the $VO_2$ film is coherently strained on the $TiO_2$ substrate for films less than $\sim 20$ nm thick. The films that displayed cracks typically exhibited multi-step metal-insulator transitions (MIT), presumably due to transitions from differently strained regions in the film. Thus, to avoid any extraneous effects during IL gating due to cracks, films much thinner than those displaying cracks were used, namely 10 nm thick. By contrast, films grown on $Al_2O_3$ (10$\bar{1}$0) were completely relaxed without any misfit strain and no cracks were observed by AFM even for films as thick as 200 nm. The MIT transition was reduced in magnitude and broadened for 10 nm thick $VO_2$ films grown on $Al_2O_3$ (10$\bar{1}$0) but films thicker than $\sim 20$ nm showed excellent, very abrupt MIT transitions with almost 4 orders of magnitude change in resistivity at the MIT. Thus, 20 and 40 nm thick films were used to make devices for IL gating.

Fabrication of Devices

Laterally gated devices were fabricated by standard photolithography techniques. The channel area was defined using a single layer of 1.3 μm thick SPR670 photoresist and the surrounding oxide film was removed by an argon ion milling etch process. The etched region was then refilled by a dielectric material that was typically $SiO_2$ but, for some samples, $Al_2O_3$ was used. No difference in properties of the devices was found with the different dielectric fills. During processing of $VO_2$ on $TiO_2$(001), the substrates became conducting after etching of the devices to define the channel, and, therefore, to suppress these conducting paths, the devices were annealed at 180° C. for 6 hours in flowing $O_2$ in a tube-furnace, before the refill. This annealing step did not alter the electronic properties of $VO_2$ as was evident from the excellent MIT characteristics after fabrication. An adhesion layer of 5 nm thick Ta was used followed by a 65 nm thick Au layer to form the electrical contacts. To prevent interaction of the IL with the contact electrodes all exposed Au surfaces outside the channel area were then covered with 50 nm $SiO_2$. Finally, a 1000×1000 μm$^2$ gate electrode was formed from a bilayer of 5 nm Ta/65 nm Au that was spaced $\sim 250$ μm from one side of the channel (see FIG. 1C). The devices were prepared with various channel areas as shown in Table 1.

Ionic Liquid Gating Experiments

Special care was taken to mitigate any contamination of the ionic liquid (IL) particularly with respect to water. An organic IL, 1-Hexyl-3methylimidazolium bis(trifluoromethylsulfonyl)-imide (HMIM-TFSI, EMD Chemicals) was specifically chosen for these studies due to its known hydrophobic nature (more so than the commonly used ILs, 1-ethyl-3-methylimidazolium bis(trifluoromethylsulfonyl) imide (EMIM-TFSI) and N,N-diethyl-N-(2-methoxyethyl)-N-methylammonium bis(trifluoromethylsulfonyl)imide (DEME-TFSI)) (24). Although all the experiments reported here use the same IL, namely HMIM-TFSI, a limited set of experiments was carried out using the more commonly used ILs, DEME-TFSI and EMIM-TFSI, which confirmed a gating response of the $VO_2$ devices similar to that when using HMIM-TFSI.

The IL was dehydrated by heating at 120° C. in high vacuum ($\sim 10^{-7}$ Torr) for several days. The water content of the IL was measured by $^1$H-NMR spectroscopy and Karl-Fischer titration and was found to be less than 50 ppm in a 1 ml sample of the IL. After wire-bonding, using Au wires, the devices were baked under the same conditions (120° C. in $\sim 10^{-7}$ Torr) for at least 6 hours and subsequently a droplet of the dehydrated IL was placed on the device that covered both the channel and the gate electrode. The device was then immediately put into a Quantum Design DynaCool which was operated using the HiVac option with a pressure of $<10^{-3}$ Torr of He during the gating experiments.

XPS Measurements

High-resolution XPS data were obtained using a monochromatic x-ray beam with a photon energy of 1486.6 eV (Al Kα). The monochromator is comprised of two quartz single crystals that focus the x-ray beam onto the sample at an angle of $\sim 78.5°$ to the sample surface. XPS studies on the electrolyte gated (EG) devices were performed on channels of 900×300 μm$^2$ areas with an x-ray spot diameter of 150 μm. The x-ray beam was aligned with the channel by maximizing the intensity of the O 1s photoemission peak (529.8 eV). For in situ XPS measurements on unpatterned, as-deposited films, a 650 μm diameter x-ray spot was used which is well within the 10×10 mm$^2$ sample area. The emitted photoelectrons were detected by a Thermo Scientific Alpha-110 hemispherical electron energy analyzer positioned along the sample normal and operating at a pass energy of 20 eV. The measurements were performed with both the un-gated and gated $VO_2$ films in their metallic state by heating the samples to 313 K for $VO_2$ on $TiO_2$(001) substrates and to 373 K for $VO_2$ on $Al_2O_3$ (10$\bar{1}$0) substrates.

SIMS Measurements

Figure 3E:
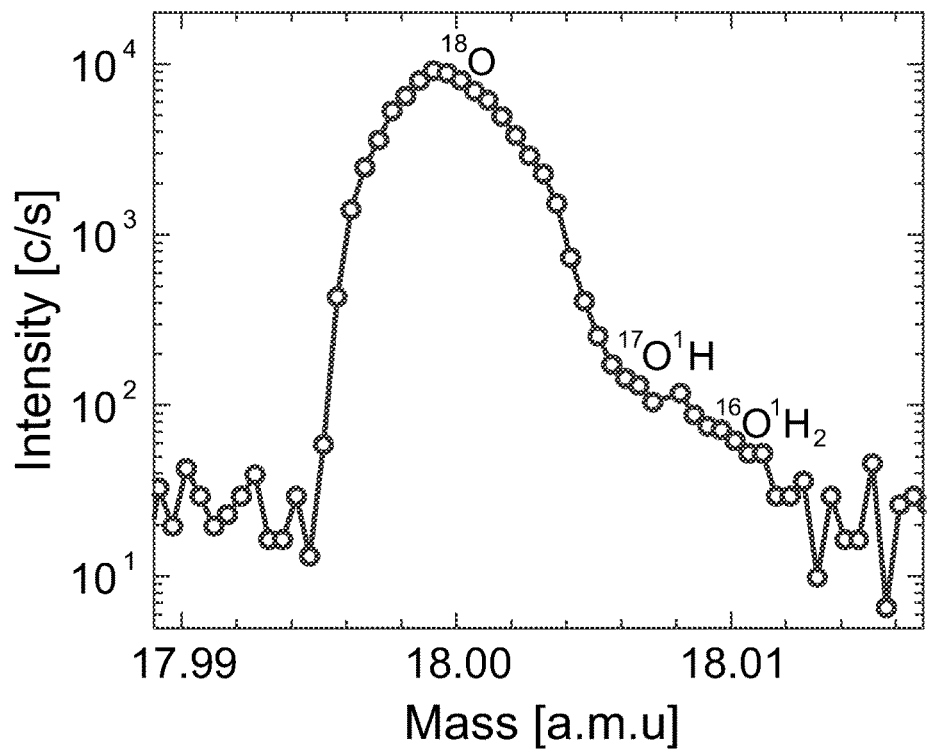

Secondary Ion Mass Spectrometry (SIMS) measurements were made with a CAMECA SC Ultra instrument. The sample was first coated with 3 nm Pt film to reduce any charging effects during these measurements. The sample was bombarded with a beam of 600 eV $Cs^+$ ions focused to a 30 μm diameter spot. The $Cs^+$ ion beam was rastered over a ~300×300 $\mu m^2$ region within the channel, but SIMS data were collected only over a central 30 μm diameter region within the rastered area to avoid any artifacts from the edge of the crater that was formed during the experiment. The instrument was operated at a mass resolution of 4000 (a.m.u./FWHM) and this was sufficient to clearly resolve $^{18}O$ from $^{16}O^1H_2$ and $^{17}O^1H$ (see FIG. 3E). We note that it has been suggested that hydrogen doping could stabilize the metallic phase of $VO_2$ (25). However, in our SIMS measurements, the $^{18}O$ signal was dominant and the signal intensity corresponding to $^{16}O^1H_2$ and $^{17}O^1H$ was several orders of magnitude smaller, providing evidence for the lack of any hydrogen in the film. Nevertheless, the role of hydrogen and its possible influence on our results cannot be completely ruled out.

Additional Experimental Results

Long-Term Stability of the Gate Induced Metallic State

The long-term stability of the metallic phase induced by gating is illustrated in FIG. 5 for a device prepared from 20 nm $VO_2/Al_2O_3$ (10$\bar{1}$0). The resistance versus temperature hysteresis curve for the device in its pristine state before any IL is applied is shown by the solid line in FIG. 5. The device was then gated to the metallic state by applying 2.2 V. The resistance versus temperature hysteresis loop was measured by varying the temperature at a rate of 3 K/minute from 360 K to 300 K and back to 360 K. The IL was then removed at room temperature by washing the device in isopropyl alcohol. The device was kept at room temperature in a dry nitrogen environment for 50 hours and then the resistance versus temperature curve was remeasured under identical temperature sweep conditions without any IL being applied. No significant change in the metallic nature of the device was found as can be seen by comparing the lines in the Figure having short dashes and long dashes.

State of $VO_2$ Channel after Washing Off Ionic Liquid

XPS measurements were used to characterize the $VO_2$ channel in various states including: (i) immediately after device fabrication, prior to application of the IL and any gating experiments, and (ii) after gating studies had been carried out that suppressed the MIT to below ~5 K. In the latter case the IL was removed after the gating procedures had been completed by rinsing the device in isopropyl alcohol. Subsequently, XPS measurements showed no evidence for peaks associated with the IL, namely an absence of F 1s, N 1s, C 1s and S 2p (see FIG. 6) peaks, indicating that the rinsing process was effective and that not even a single monolayer of the IL remained on the surface. Furthermore, we remeasured the resistance versus temperature characteristics of the gated devices after the XPS measurements to confirm that the electrical properties of the device were not altered during rinsing off of the IL and the XPS measurements themselves. No significant changes in the resistance versus temperature curves were found.

Dynamics of Ionic Liquid Gating and Stabilization of the Metallic State

Figure 7A:
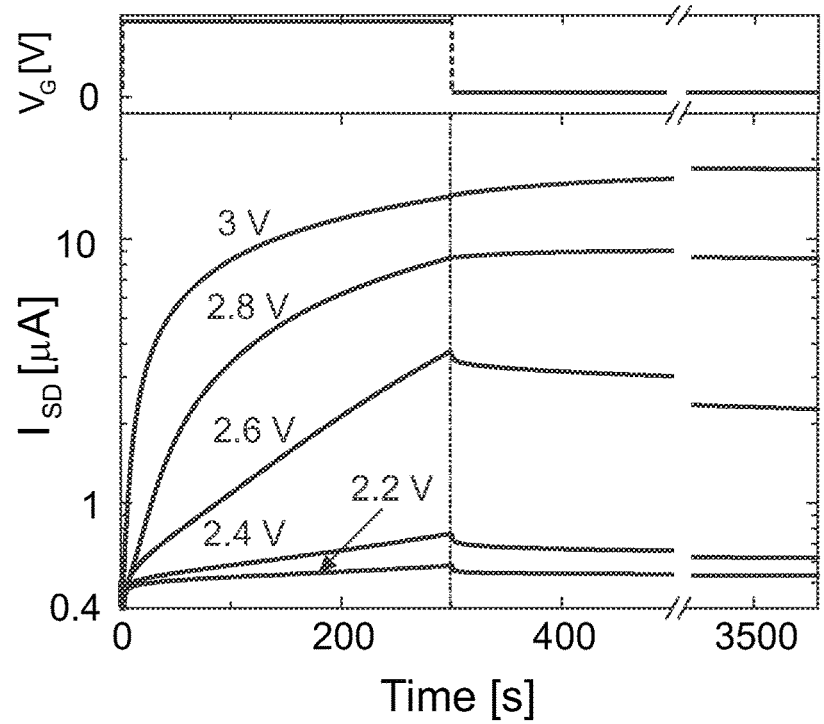
FIG. 7. Temporal changes in the source-drain current of a 20 nm $VO_2/Al_2O_3$ (10$\bar{1}$0) device. (A) Source-drain current as a function of time on applying a positive gate voltage for 300 s with values varying from 2.2 to 3 V and then setting the gate voltage to zero. Top panel shows a schematic of the applied gate voltage versus time. (B) Source-drain current versus time after first applying a gate voltage of 2.6 V for 300 s and then applying a reverse gate voltage varying from −0.5 to −2.6V. Top panel shows the applied gate voltage versus time schematic. All measurements were carried out inside a high vacuum chamber at a pressure of ~$10^{-7}$ Torr. The vertical dash-dotted lines in the bottom panels correspond to the change in voltage shown in the top panels.
Figure 7B:
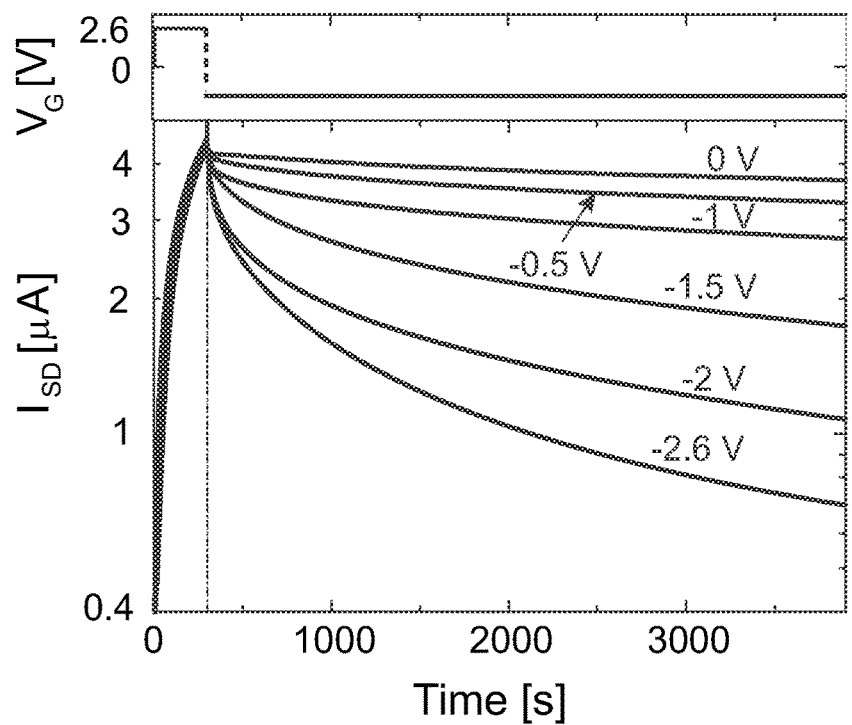
Figure 8:
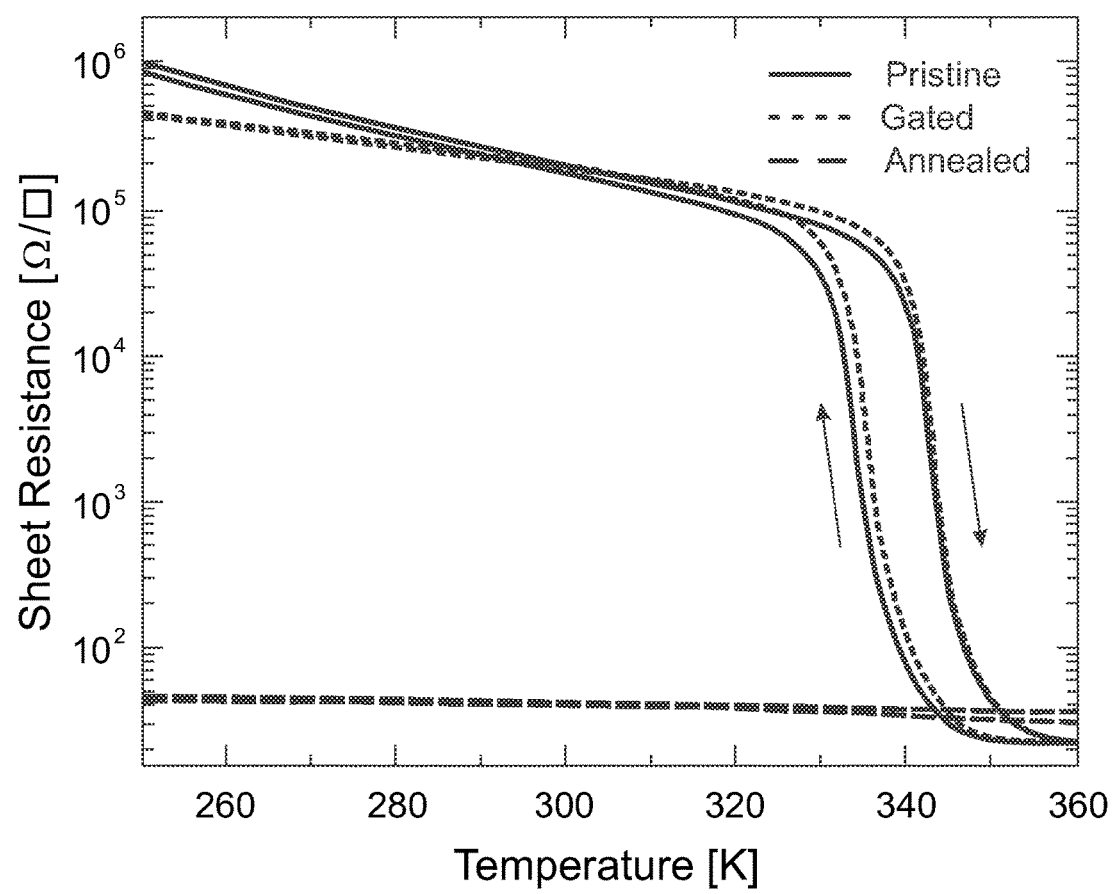
FIG. 8. Sheet resistance versus temperature of a 20 nm $VO_2/Al_2O_3$ (10$\bar{1}$0) device in pristine condition before any IL is applied (solid line) and after the device was gated to the metallic state (short dashes) by applying $V_G$=2 V and varying the temperature at a rate of 3 K/minute from 360 K to 250 K and back to 360 K. The IL was then removed at room temperature by washing the device in isopropyl alcohol. The device was then remeasured (long dashes) after it was annealed in a tube furnace in flowing oxygen at 200° C. for 1 hour.

Long timescales are needed to reach a steady state after gating or reverse gating $VO_2$ EG devices, whether on $Al_2O_3$ (10$\bar{1}$0) or $TiO_2$(001), as illustrated in FIG. 7 for a device formed from 20 nm $VO_2/Al_2O_3$ (10$\bar{1}$0). FIG. 7A shows the temporal changes in the source-drain current when a constant gate voltage, varied from 2.2-3 V, is applied for a period of 300 s at room temperature and $V_{SD}$=0.1 V. The measurements are performed in a high vacuum of $10^{-7}$ Torr. After the gate voltage is applied for 300 s $I_{SD}$ reaches a nearly constant value that continues to slowly evolve after the gate voltage is set to zero, even as the device remains in a conducting state. As shown in FIG. 7A $I_{SD}$ either decreases or increases after $V_G$ is set to zero. However, after some further time at $V_G$=0, $I_{SD}$ reaches a value that remains approximately constant over many hours. Similarly, reverse gating results in slow changes in hp, as shown in FIG. 7B. The device was first set to a conducting state by applying $V_G$=2.6 V for 300 s. Then $V_G$ was set to a negative value varying from −0.5 to −2.6 V. Data are also shown for $V_G$=0 for comparison. The device gradually reverts to the insulating state over a period of more than 1 hour. The timescales for the observed changes in $I_{SD}$ are much longer than the expected IL equilibration times in response to a gate voltage (26).

The insulating state could be recovered by reverse gating or alternatively by annealing in oxygen at elevated temperatures. An example is given in FIG. 8 where the sheet resistance versus temperature curves of a 20 nm $VO_2/Al_2O_3$ (10$\bar{1}$0) device are compared in the pristine condition before any IL is applied (solid line), after the device was first gated to the metallic state (short dashes), and after the IL was removed and the device was annealed in a tube furnace in flowing oxygen at 200 C for 1 hour (long dashes). The MIT was recovered by this annealing procedure.

Resistivity Versus Temperature Characteristics for EG Devices Formed from $VO_2/Al_2O_3$ (10$\bar{1}$0).

Figure 10:
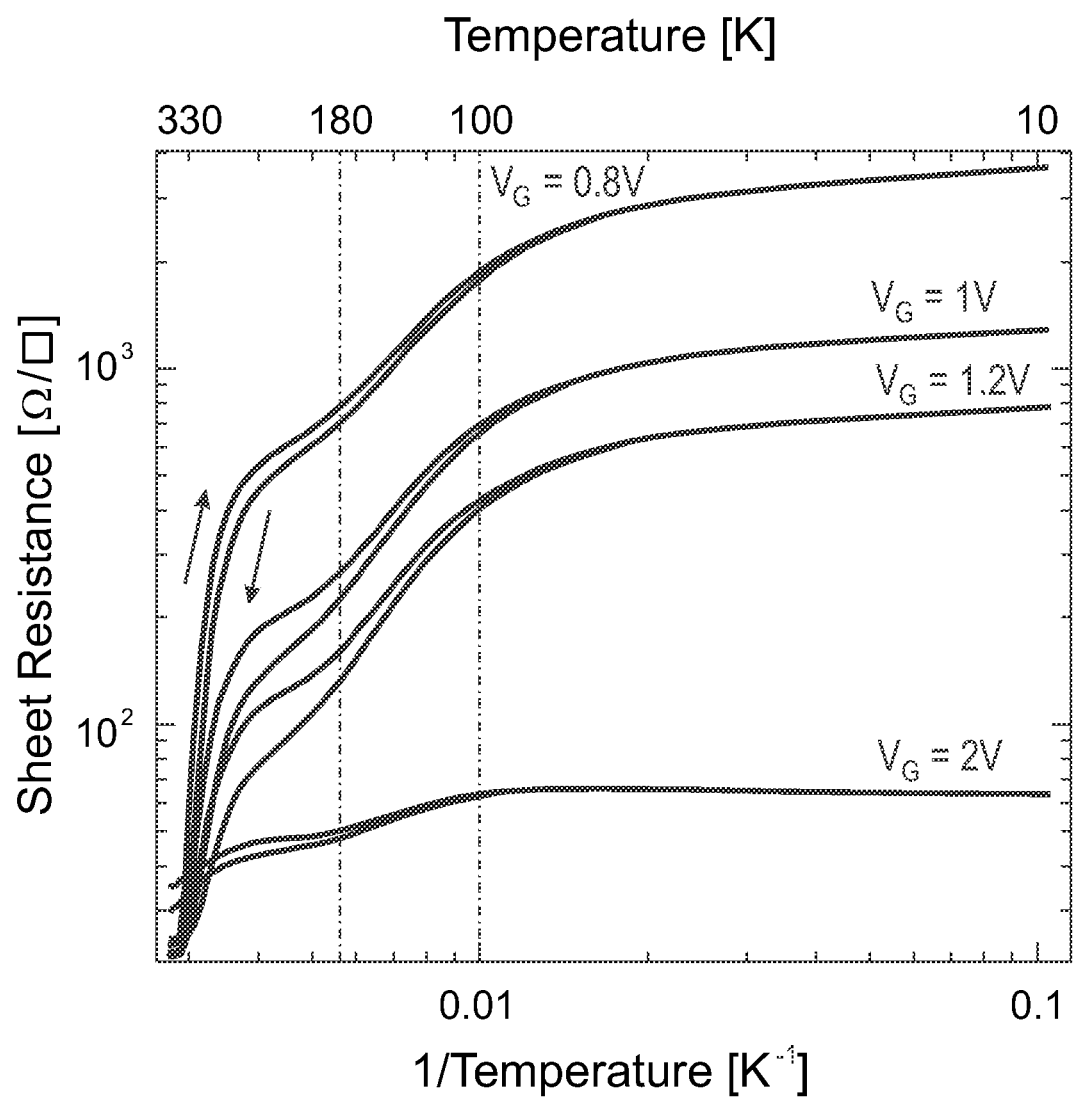
FIG. 10. Gate-voltage dependent resistance versus temperature curves for a $VO_2/Al_2O_3$(10$\bar{1}$0) device. Sheet resistance as a function of the reciprocal of temperature for a device fabricated from 20 nm $VO_2/Al_2O_3$(10$\bar{1}$0) gated to several different voltages shows evidence for a second phase transition within the range of 100-180 K. The dash-dotted lines are guides to the eye.

Electrolyte gating data for devices prepared using 20 nm thick $VO_2$ on $Al_2O_3$ are shown in FIG. 9. These devices show a response to EG largely similar to devices on $TiO_2$ with similar gate voltages suppressing the MIT even though the $T_{MIT}$ of the ungated sample is initially much higher (340 K vs. 290 K). One distinct difference is that the temperature dependence of $R_S$ shows evidence for the possible emergence of a second phase transition below ~200 K, as more clearly indicated when the same resistance data are replotted versus inverse temperature as in FIG. 10. In this Figure the region highlighted within the dash-dotted lines indicates a possible second phase. Here a single activation energy cannot account for the temperature dependence of $R_S$. No evidence was found for any similar features in thin films deposited on $TiO_2$(001) substrates.

These features are suggestive of the presence of a second phase that has an MIT within the range of 100-180 K. We note that $V_2O_3$ has an MIT in this temperature range (27) and that $Al_2O_3$ has the same crystal structure as the metallic phase of $V_2O_3$. It is thus possible to achieve epitaxial stabilization of the $V_2O_3$ phase on $Al_2O_3$ (10$\bar{1}$0) while this is not possible on $TiO_2$(001), which has the same structure as the metallic phase of $VO_2$. Another possibility is the formation of local magneli-like phases through the agglomeration of oxygen vacancies into extended defects, such as shear planes (28-30). It is difficult to determine the nature of this secondary phase but the presence of the anomaly in the temperature dependence of the transport data is suggestive of a compositional inhomogeneity that is absent in the pristine films.

Topography of Thin Films

Figure 11B:
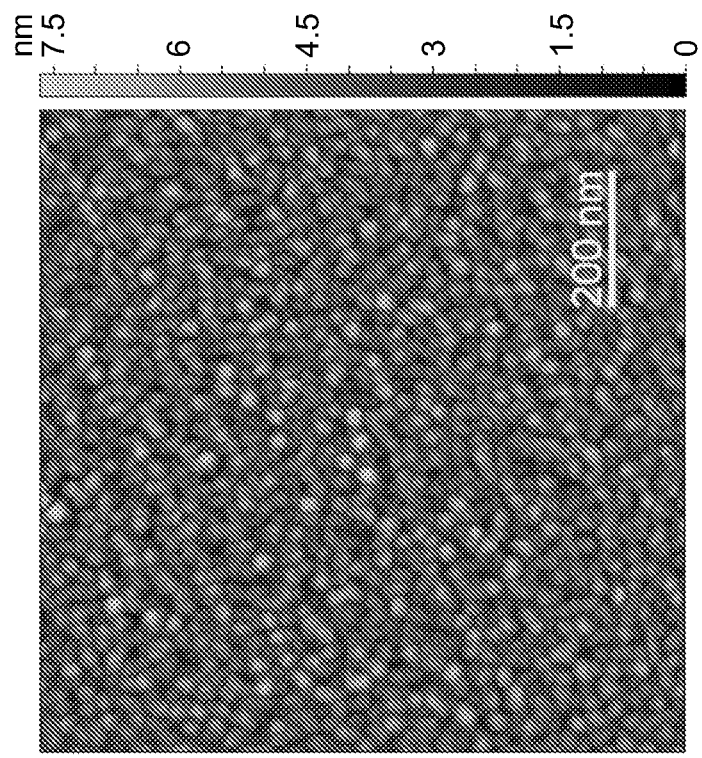
FIG. 11. Topography of $VO_2$ thin films. (A) AFM image for a 10 nm $VO_2$ film deposited on $TiO_2$(001). This film is atomically smooth with an RMS roughness of ~0.2 nm. (B) AFM image of a 20 nm $VO_2$ film deposited on $Al_2O_3$ (10$\bar{1}$0) substrate. This film has an RMS roughness of ~1 nm.
Figure 11A:
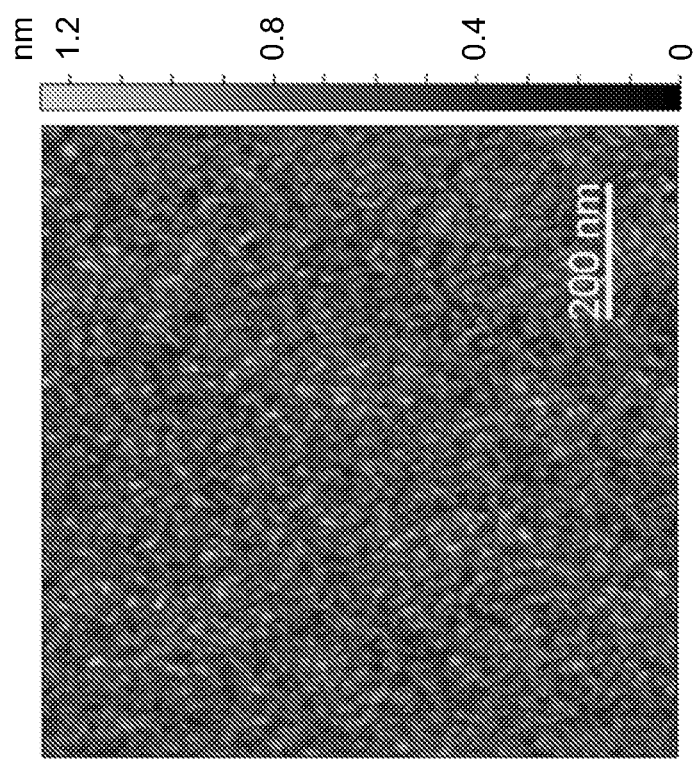

Atomic force microscopy images of $VO_2$ deposited on $TiO_2$(001) and $Al_2O_3$ (10$\bar{1}$0) substrates are shown in FIG. 11. While the 10 nm thick $VO_2$ films on $TiO_2$(001) substrates are atomically smooth with an RMS roughness of less than 0.2 nm (averaged over a 1×1 $\mu m^2$ area), the thin films on Al$_2$O$_3$(10$\bar{1}$0) substrates have a larger RMS roughness of ~1 nm. No measurable changes in topography were observed after gating under the conditions discussed here.

Structure of Films

Figure 12:
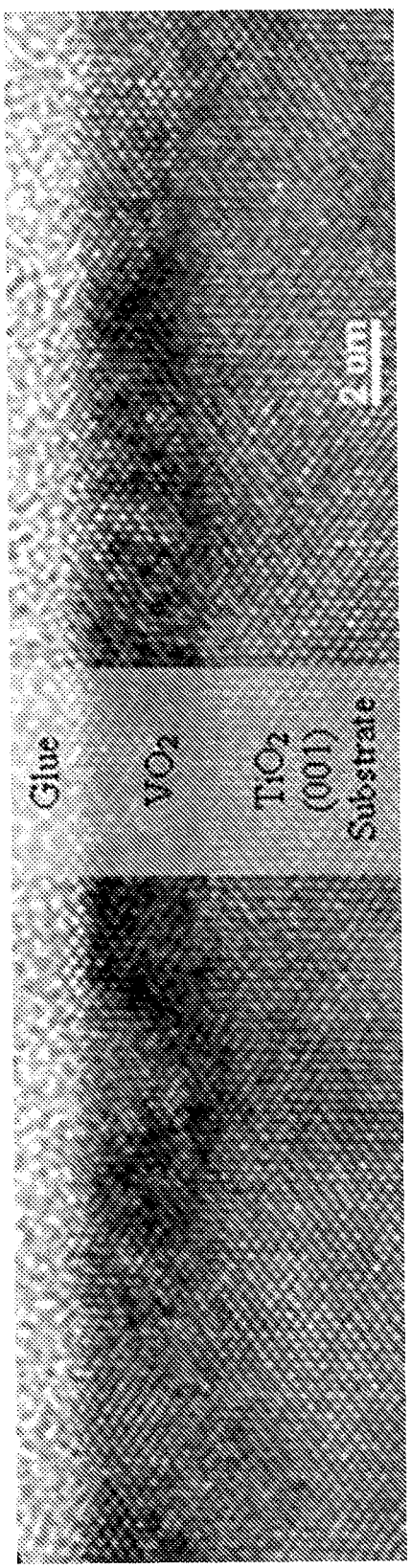
FIG. 12. A high-resolution cross-section transmission electron microscopy image of a 2.7 nm thick $VO_2$ film deposited on $TiO_2$(001). The image is taken along the [010] zone axis in the rutile structure. There is significant damage to both the film and the $TiO_2$ single crystal substrate from the focused ion milling used to prepare the sample. Nevertheless, the image clearly shows that the $VO_2$ film grows epitaxially with the $TiO_2$ substrate.

A high-resolution cross-section transmission electron microscopy image of a 2.7 nm thick VO$_2$ film deposited on TiO$_2$(001) is shown in FIG. 12. The Figure indicates that the film is epitaxial with the single crystalline TiO$_2$ substrate with the same structure and crystal orientation. The micrograph is taken at room temperature, which is above the T$_{MIT}$ for this film which occurs at ~295 K.

Applications

The demonstration that the conductivity of a thin film of vanadium dioxide can be substantially changed by removing or adding oxygen atoms by the process of applying an ionic liquid to its surface and subjecting this liquid to an electric field allows for a large family of devices for various purposes including latches, switches, 2-terminal and 3-terminal transistors and non-volatile memory elements. One element of one such a device 210 is shown in the schematic sketch in FIG. 14. The device 210 includes an insulating dielectric layer 230 which has been patterned by standard lithographic techniques (e.g., by patterning a photoresist layer to define the various elements) to form a channel 240, which is contacted at either end by electrical contacts 250*a* and 250*b* designated as the source contact and drain contact, respectively. A conduit 220 through which the ionic liquid is passed is formed from dielectric insulating materials by forming the side-walls 260 of the conduit 220. A gate 270 to the ionic liquid is formed on one side of the ionic liquid away from the channel 240. The conduit 220 will likely be fully enclosed by dielectric material (not shown in FIG. 14).

Figure 15:
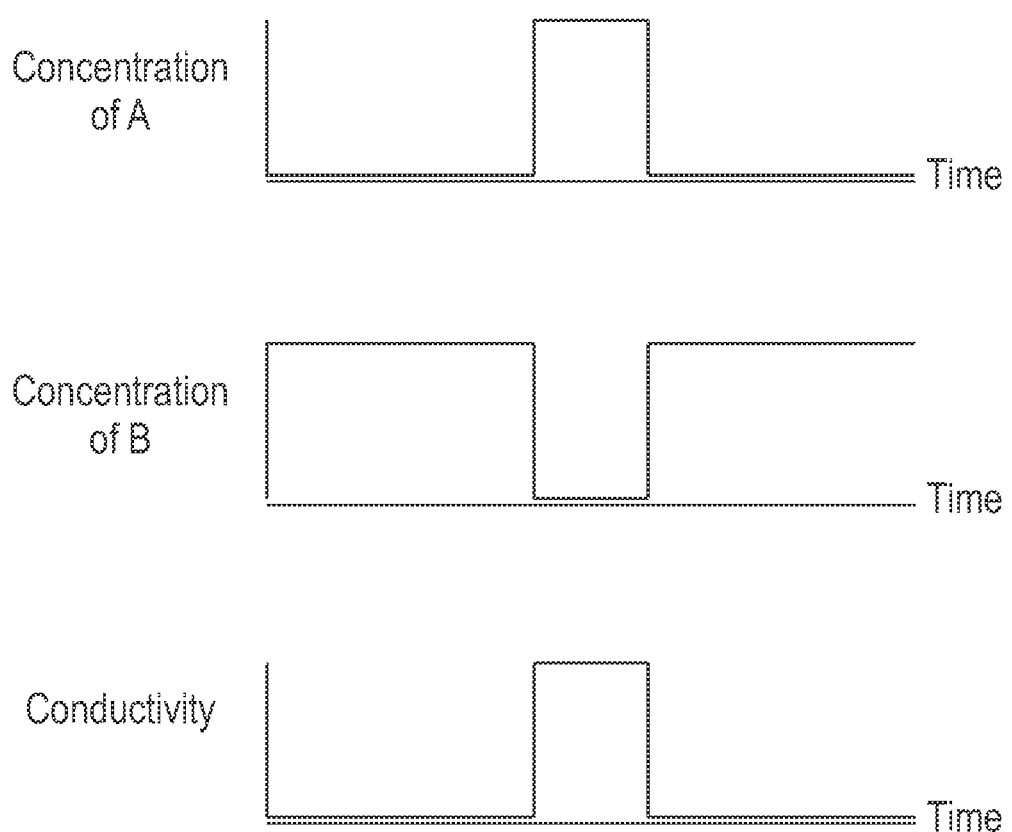
FIGS. 15, 16, and 17 illustrate methods in which the concentration of one or more ionic liquids can be varied over time to effect a change in the conductivity of the channel of the device, by applying a gate voltage.

The device is operated by passing an ionic liquid along the conduit 220 using standard procedures and methods well known from the fields of microfluidics and nanofluidics (e.g., a pump may be used to force the ionic liquid through the conduit). An example of the operation of the device element 210 is given in FIG. 15. Two different liquids are introduced sequentially into the conduit 220. Thus the concentration of liquid A in the conduit 220 is initially zero and the conduit is filled by liquid B. Away from the channel 240 and further along the conduit 220 the concentration of liquid B falls to zero, and there is a certain length of the conduit that is filled with liquid A. Beyond this length the conduit is again filled with liquid B. Thus when the liquid in the conduit 220 is moved across the channel 240 there will be a finite period of time for which the channel will be covered by ionic liquid A but otherwise the channel will be covered by liquid B. The liquids are chosen so that in the presence of a certain gate voltage, only when liquid A is present are there any currents of ions in the liquid moving towards or away from the surface of the channel 240 (depending on the sign of the gate voltage).

Figure 16:
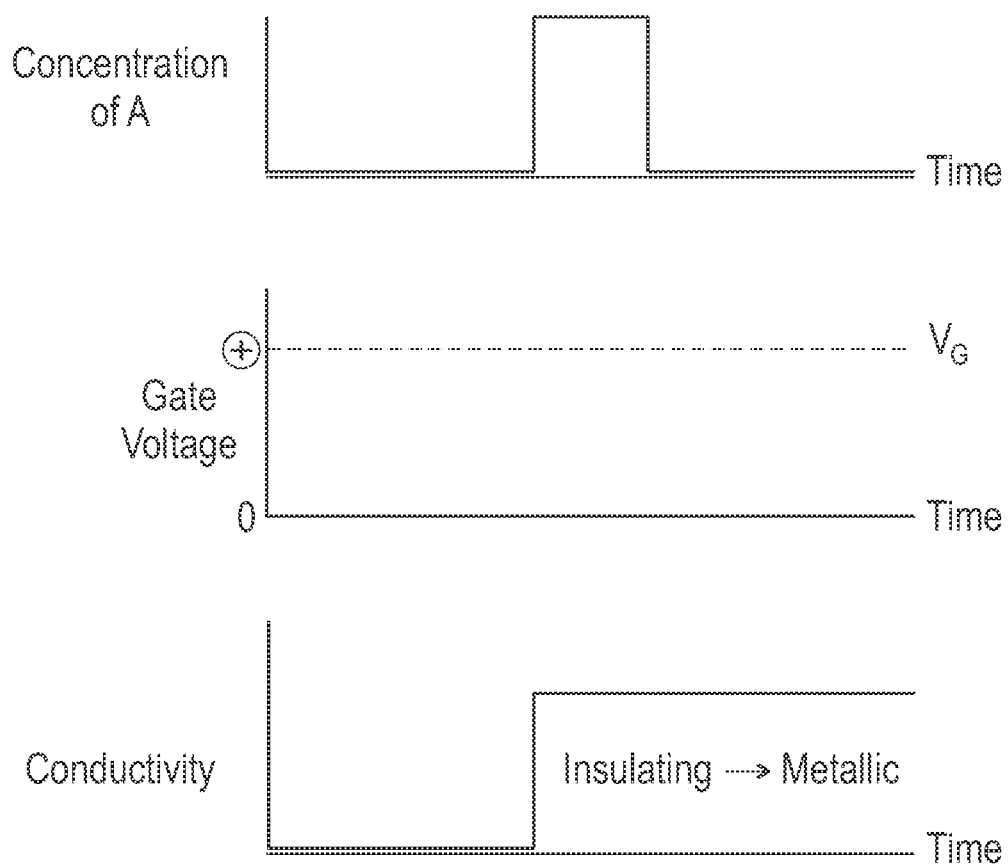

An example of operation of the device element 210 is shown in FIG. 16. The channel 240 is initially in an insulating (or semiconducting) state. A gate voltage V$_G$ is then applied to the gate 270. The liquid A is chosen to be an ionic liquid that results in an ionic current that flows from the surface of the channel 240 into the liquid or vice versa for gate voltages that exceed some threshold. V$_G$ is chosen to have a magnitude larger than this threshold voltage. Thus when the liquid A is moved over the channel 240, as described by the operation shown in FIG. 15, an ionic current will flow from the surface of the channel into the liquid A. This results in changing the state of the channel from insulating (or semiconducting) to conducting. The change in conductance can be varied by, for example, varying the length of the conduit 220 occupied by the liquid A, or by varying the speed at which the liquid A is moved across the channel area, or by allowing the liquid A to remain in the channel 240 for a period of time by stopping the motion of the liquid for a period of time, or by varying the gate voltage above the threshold voltage, or by using a combination of one or more of these methods. Although FIG. 16 shows an abrupt change in state of the channel 240 from insulating (or semiconducting) to metallic (i.e., conducting), this change may take a period of time that can be varied by, for example, varying the gate voltage. This may also depend on any mixing of the liquids A and B at their interface across the conduit 220 where they meet. The gate voltage can also be applied for a time that is shorter or longer than the time that the liquid A remains in the channel 240. The most reliable methods of operation are when the gate voltage is applied for a time substantially longer than the time the liquid A spends in the channel 240, or alternately a time that is much shorter than the time that the liquid A spends in the channel. For the most energy efficient operation, the gate voltage can be applied for the minimum time required to convert the channel 240 to the metallic state (i.e., the conducting state).

Figure 17:
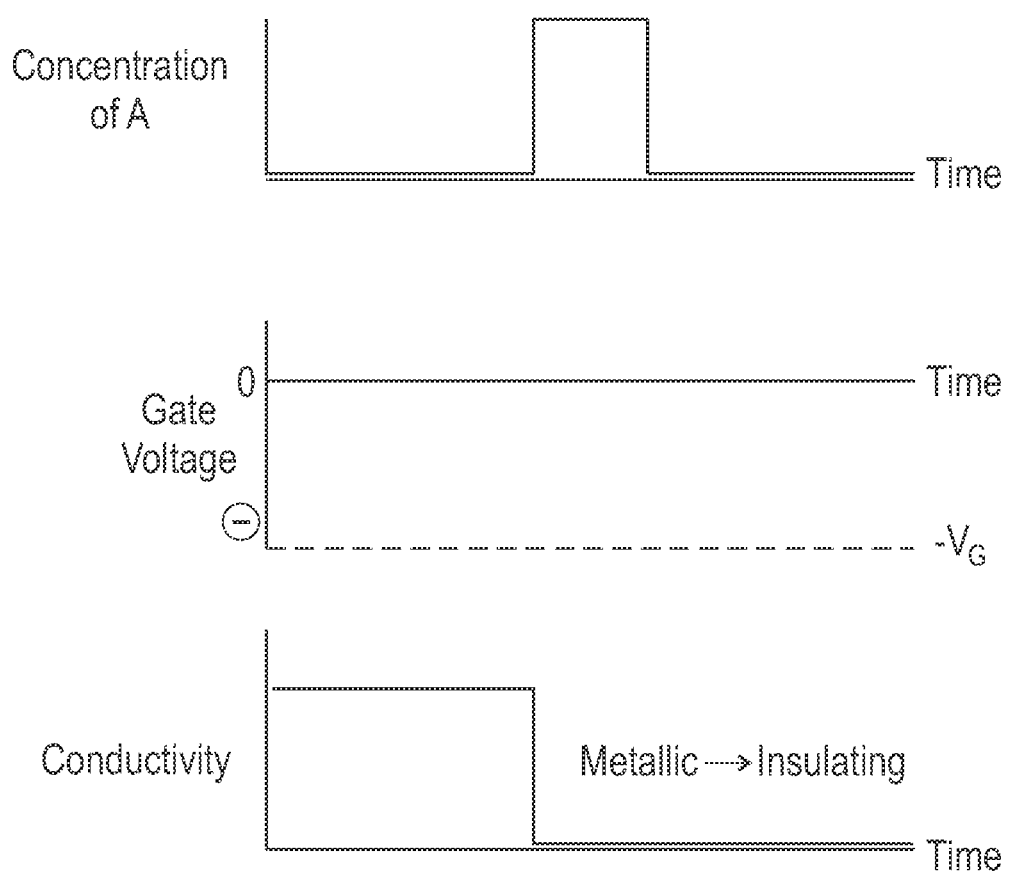

Once the channel 240 has been converted to a metallic state, an operation similar to that shown in FIG. 16 can be used to convert the channel back to an insulating (or semiconducting) state, as illustrated in FIG. 17. The liquid A is moved along the conduit 220 to the channel 240 for a finite period of time (see the top panel of FIG. 17). However, in this case, a gate voltage having a polarity opposite to that used in FIG. 16 is applied (see the middle panel of FIG. 17); the state of the channel 240 is converted back to the insulating (or semiconducting) state by this process (see the bottom panel of FIG. 17).

In another embodiment, an ionic liquid may be disposed over the channel and remain there (i.e., it does not flow) while voltage is applied to the gate. In this case, the conductivity of the channel can be made to alternate between insulating (or semiconducting) and metallic (conducting) by reversing the polarity of the voltage. In yet another embodiment, an ionic liquid may disposed over a channel, such that the conductivity of the channel changes in response to compositional changes of the ionic liquid, e.g., certain ions in the liquid may be preferentially adsorbed onto the surface of the channel (while other types of ions are displaced from the surface), thereby modifying the conductivity of the channel. The change in the concentrations of these ions in the liquid may manifest itself as an inhomogeneity in the composition of the liquid.

Figure 14:
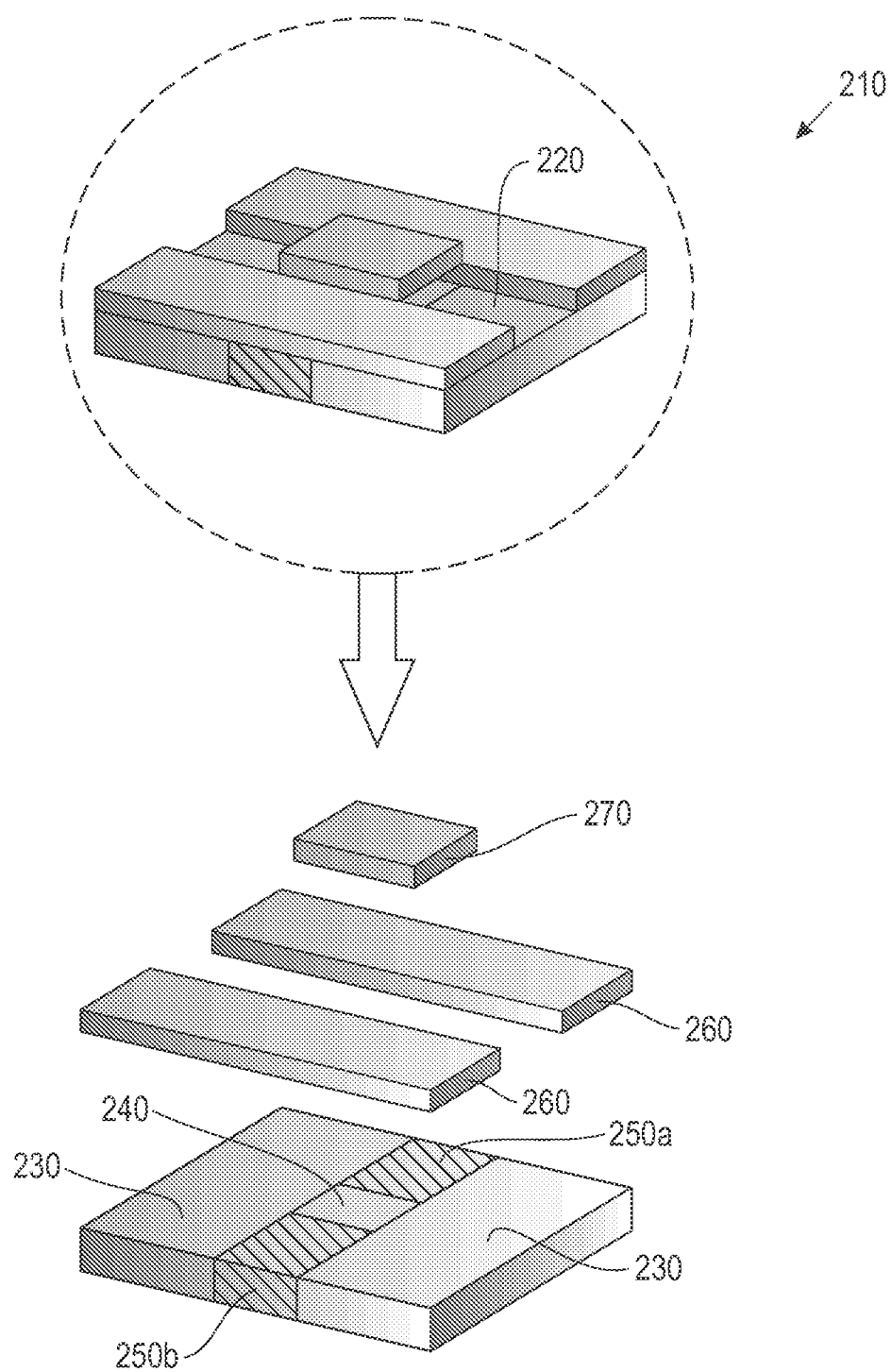
FIG. 14 shows a device utilizing the methods described herein.

While the channel 240 shown in FIG. 14 is composed of the horizontal surface of an insulating material, the channel could equally well be composed of a vertical surface or a surface inclined at any angle or multiple surfaces, for example, the surfaces of a suspended wire around which ionic liquid is passed. A voltage can be applied to the ionic liquid by a surrounding gate electrode. For example, the liquid could be moved through a conduit with a circular or elliptical cross-section within which is suspended a wire, the surfaces of which form the channel. The wire can be transformed partially or completely between its insulating (or semiconducting) and metallic (i.e., conducting) states. The device element shown in FIG. 14 and related devices may be used for building non-volatile memory elements, or for the purpose of building logic gates, or for the purpose of building synaptic elements for cognitive computing hardware applications, such as those described in US Published Patent Application 20100220523 to Modha and Parkin, filed Mar. 1, 2009 (application Ser. No. 12/395,695) and titled "Stochastic Synapse Memory Element with Spike-timing Dependent Plasticity (STDP)", which is hereby incorporated by reference.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

REFERENCES AND NOTES

1. C. H. Ahn et al., Electrostatic modification of novel materials. *Rev. Mod. Phys.* 78, 1185 (2006).
2. A. Cavalleri et al., Band-Selective Measurements of Electron Dynamics in $VO_2$ Using Femtosecond Near-Edge X-Ray Absorption. *Phys. Rev. Lett.* 95, 067405 (2005).
3. H. Takagi, H. Y. Hwang, An Emergent Change of Phase for Electronics. *Science* 327, 1601 (2010).
4. J. Robertson, Band offsets of wide-band-gap oxides and implications for future electronic devices. *J. Vac. Sci. Technol. B* 18, 1785 (2000).
5. A. Ohtomo, H. Y. Hwang, A high-mobility electron gas at the $LaAlO_3/SrTiO_3$ heterointerface. *Nature* 427, 423 (2004).
6. P. Moetakef et al., Electrostatic carrier doping of $GdTiO_3/SrTiO_3$ interfaces. *Appl. Phys. Lett.* 99, 232116 (2011).
7. M. Galiński, A. Lewandowski, I. Stępniak, Ionic liquids as electrolytes. *Electrochimica Acta* 51, 5567 (2006).
8. K. Ueno et al., Electric-field-induced superconductivity in an insulator. *Nat. Mater.* 7, 855 (2008).
9. J. T. Ye et al., Liquid-gated interface superconductivity on an atomically flat film. *Nat. Mater.* 9, 125 (2010).
10. Y. Lee et al., Phase Diagram of Electrostatically Doped $SrTiO_3$. *Phys. Rev. Lett.* 106, 136809 (2011).
11. M. M. Qazilbash et al., Mott Transition in $VO_2$ Revealed by Infrared Spectroscopy and Nano-Imaging. *Science* 318, 1750 (2007).
12. M. Liu et al., Terahertz-field-induced insulator-to-metal transition in vanadium dioxide metamaterial. *Nature* 487, 345 (2012).
13. F. J. Morin, Oxides Which Show a Metal-to-Insulator Transition at the Neel Temperature. *Phys. Rev. Lett.* 3, 34 (1959).
14. M. Nakano et al., Collective bulk carrier delocalization driven by electrostatic surface charge accumulation. *Nature* 487, 459 (2012).
15. M. Imada, A. Fujimori, Y. Tokura, Metal-insulator transitions. *Rev. Mod. Phys.* 70, 1039 (1998).
16. Most of the experimental details are described in a subsequent section.
17. J. Cao et al., Strain engineering and one-dimensional organization of metal-insulator domains in single-crystal vanadium dioxide beams. *Nat. Nano.* 4, 732 (2009).
18. N. F. Mott, *Metal Insulator Transitions*. (Taylor & Francis Ltd., New York, ed. 2nd, 1990).
19. R. Restori, D. Schwarzenbach, J. R. Schneider, Charge density in rutile, TiO2. *Acta Cryst. B* 43, 251 (1987).
20. W. H. Rosevear, W. Paul, Hall Effect in $VO_2$ near the Semiconductor-to-Metal Transition. *Phys. REv. B* 7, 2109 (1973).
21. G. Silversmit, D. Depla, H. Poelman, G. B. Marin, R. De Gryse, Determination of the V2p XPS binding energies for different vanadium oxidation states (V5+ to V0+). *J. Electron Spectrosc. Relat. Phenom.* 135, 167 (2004).
22. A. Janotti et al., Hybrid functional studies of the oxygen vacancy in $TiO_2$. *Phys. Rev. B* 81, 085212 (2010).
23. R. Kötz, M. Carlen, Principles and applications of electrochemical capacitors. *Electrochimica Acta* 45, 2483 (2000).
24. J. Ranke, A. Othman, P. Fan, A. Müller, Explaining Ionic Liquid Water Solubility in Terms of Cation and Anion Hydrophobicity. *Int. J. Mol. Sci.* 10, 1271 (2009).
25. J. Wei, H. Ji, W. Guo, A. H. Nevidomskyy, D. Natelson, Hydrogen stabilization of metallic vanadium dioxide in single-crystal nanobeams. *Nat. Nano.* 7, 357 (2012).
26. J. H. Cho et al., Printable ion-gel gate dielectrics for low-voltage polymer thin-film transistors on plastic. *Nat. Mater.* 7, 900 (2008).
27. J. Brockman, M. G. Samant, K. P. Roche, S. S. P. Parkin, Substrate-induced disorder in $V_2O_3$ thin films grown on annealed c-plane sapphire substrates. *Appl. Phys. Lett.* 101, 051606 (2012).
28. S. Andersson, A. D. Wadsley, Crystallographic Shear and Diffusion Paths in Certain Higher Oxides of Niobium, Tungsten, Molybdenum and Titanium. *Nature* 211, 581 (1966).
29. L. A. Bursill, D. J. Smith, Interaction of small and extended defects in nonstoichiometric oxides. *Nature* 309, 319 (1984).
30. U. Schwingenschlögl, V. Eyert, The vanadium Magneli phases $V_nO_{2n-1}$. *Ann. Phys.* 13, 475 (2004).
31. S. Caporali, U. Bardi, A. Lavacchi, X-ray photoelectron spectroscopy and low energy ion scattering studies on 1-buthyl-3-methyl-imidazolium bis(trifluoromethane) sulfonimide. *J. Electron Spectrosc. Relat. Phenom.* 151, 4 (2006).

The invention claimed is:

1. A method for use with a conduit having a surface of an oxide, the surface being in contact with electrical contacts, the method comprising:
   (A) introducing a first liquid into the conduit, the oxide being insulating or semiconducting;
   (B) in the presence of a first electric field, displacing the first liquid with a second liquid that is ionic, thereby changing the conductivity of the oxide to a metallic state, wherein a first gate voltage is applied to a gating element in proximity with the conduit to produce the first electric field; and
   (C) washing away the second liquid, while maintaining the conductivity of the oxide in the metallic state,
   wherein the first and second liquids are different.

2. The method of claim 1, wherein the first gate voltage is applied throughout at least step (B).

3. The method of claim 2, further comprising:
   (D) in the presence of a second electric field, using the second liquid to displace any liquid in the conduit, thereby changing the conductivity of the oxide to an insulating or semiconducting state; and
   (E) then washing away the second liquid, while maintaining the conductivity of the oxide in the insulating or semiconducting state;
   wherein a second gate voltage is applied to the gating element to produce the second electric field, the second gate voltage having a polarity opposite that of the first gate voltage.

4. The method of claim 1, wherein said second liquid is 1-Hexyl-3methylimidazolium bis(trifluoromethylsulfonyl)-imide.

5. The method of claim 1, wherein the first gate voltage is chosen to have a magnitude greater than a threshold value above which an ionic current is induced in the second liquid.

6. The method of claim 1, comprising varying the first gate voltage to control the period of time required to switch to the metallic state.

7. The method of claim 1, wherein the first gate voltage is applied for a time substantially longer than the time the second liquid is in contact with the oxide.

8. The method of claim 1, wherein the first gate voltage is applied for a time substantially shorter than the time the second liquid is in contact with the oxide.

9. The method of claim 1, wherein the conductivity of the oxide is made to alternate between (i) metallic and (ii) insulating or semiconducting, by reversing the polarity of the first gate voltage.

10. The method of claim 1, wherein the conductivity of the oxide persists in the metallic state, upon removal of the first gate voltage.

11. The method of claim 1, wherein the oxide is in the form of a wire.

12. The method of claim 3, wherein the oxide is in the form of a wire.

13. The method of claim 1, wherein the oxide is vanadium oxide.

14. The method of claim 3, wherein the oxide is vanadium oxide.

15. The method of claim 1, wherein both the first and second liquids are ionic.

16. The method of claim 3, wherein both the first and second liquids are ionic.

* * * * *